United States Patent
Hsu et al.

(10) Patent No.: US 11,004,535 B1
(45) Date of Patent: May 11, 2021

(54) ROBUST STORAGE OF BAD COLUMN DATA AND PARITY BITS ON WORD LINE

(71) Applicant: SanDisk Technologies LLC, Addison, TX (US)

(72) Inventors: Hua-Ling Cynthia Hsu, Milpitas, CA (US); YenLung Li, San Jose, CA (US); Aaron Lee, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/717,494

(22) Filed: Dec. 17, 2019

(51) Int. Cl.
*G11C 29/00* (2006.01)
*G11C 29/02* (2006.01)
*G11C 7/10* (2006.01)
*G11C 11/4094* (2006.01)
*G11C 11/408* (2006.01)

(52) U.S. Cl.
CPC ............ *G11C 29/848* (2013.01); *G11C 7/106* (2013.01); *G11C 7/1087* (2013.01); *G11C 11/4085* (2013.01); *G11C 11/4094* (2013.01); *G11C 29/022* (2013.01)

(58) Field of Classification Search
CPC ..... G11C 29/848; G11C 29/022; G11C 7/106; G11C 11/4085; G11C 11/4094; G11C 7/1087
USPC ........................................................ 365/200
See application file for complete search history.

(56) References Cited

U.S. PATENT DOCUMENTS

| | | | |
|---|---|---|---|
| 7,405,985 B2 | 7/2008 | Cernea et al. | |
| 7,650,528 B2 | 1/2010 | Rahman et al. | |
| 7,747,913 B2* | 6/2010 | Abella | G06F 11/1064 |
| | | | 714/718 |
| 7,843,746 B2 | 11/2010 | Ryu | |
| 8,732,563 B2* | 5/2014 | Picchi | H04L 25/067 |
| | | | 714/781 |
| 9,177,661 B2 | 11/2015 | Hara et al. | |
| 9,262,268 B2 | 2/2016 | Cai et al. | |
| 9,666,307 B1 | 5/2017 | Fujiwara et al. | |
| 10,133,625 B2 | 11/2018 | Bandic et al. | |
| 10,339,020 B2* | 7/2019 | Fukutomi | G06F 11/14 |
| 2004/0177309 A1* | 9/2004 | Kreso | H03M 13/11 |
| | | | 714/763 |
| 2009/0059647 A1* | 3/2009 | Hoya | G11C 11/22 |
| | | | 365/145 |
| 2011/0002169 A1 | 1/2011 | Li et al. | |
| 2017/0091027 A1* | 3/2017 | Sohn | G11C 29/52 |
| 2019/0294378 A1* | 9/2019 | Ware | G06F 3/0659 |

(Continued)

*Primary Examiner* — Fernando Hidalgo
(74) *Attorney, Agent, or Firm* — Vierra Magen Marcus LLP

(57) ABSTRACT

Apparatuses and techniques are described for reliably storing bad column data in a memory device. Units of bad column data and related units of error detection data are stored in non-adjacent groups of memory cells connected to a word line in a ROM block. A unit of bad column data and a related unit of error detection data can be stored in respective groups of memory cells which are relatively far apart from one another along the word line. This helps ensure that a defect in some NAND strings will not affect both the unit of bad column data and a related unit of error detection data. In another aspect, a unit of bad column data and a related unit of error detection data can be stored using different input/output circuits to further increase robustness.

20 Claims, 20 Drawing Sheets

(56) References Cited

U.S. PATENT DOCUMENTS

2020/0004627 A1* 1/2020 Sharon .................. G06F 3/0689
2020/0319953 A1* 10/2020 Kim ..................... G11C 7/1039

* cited by examiner

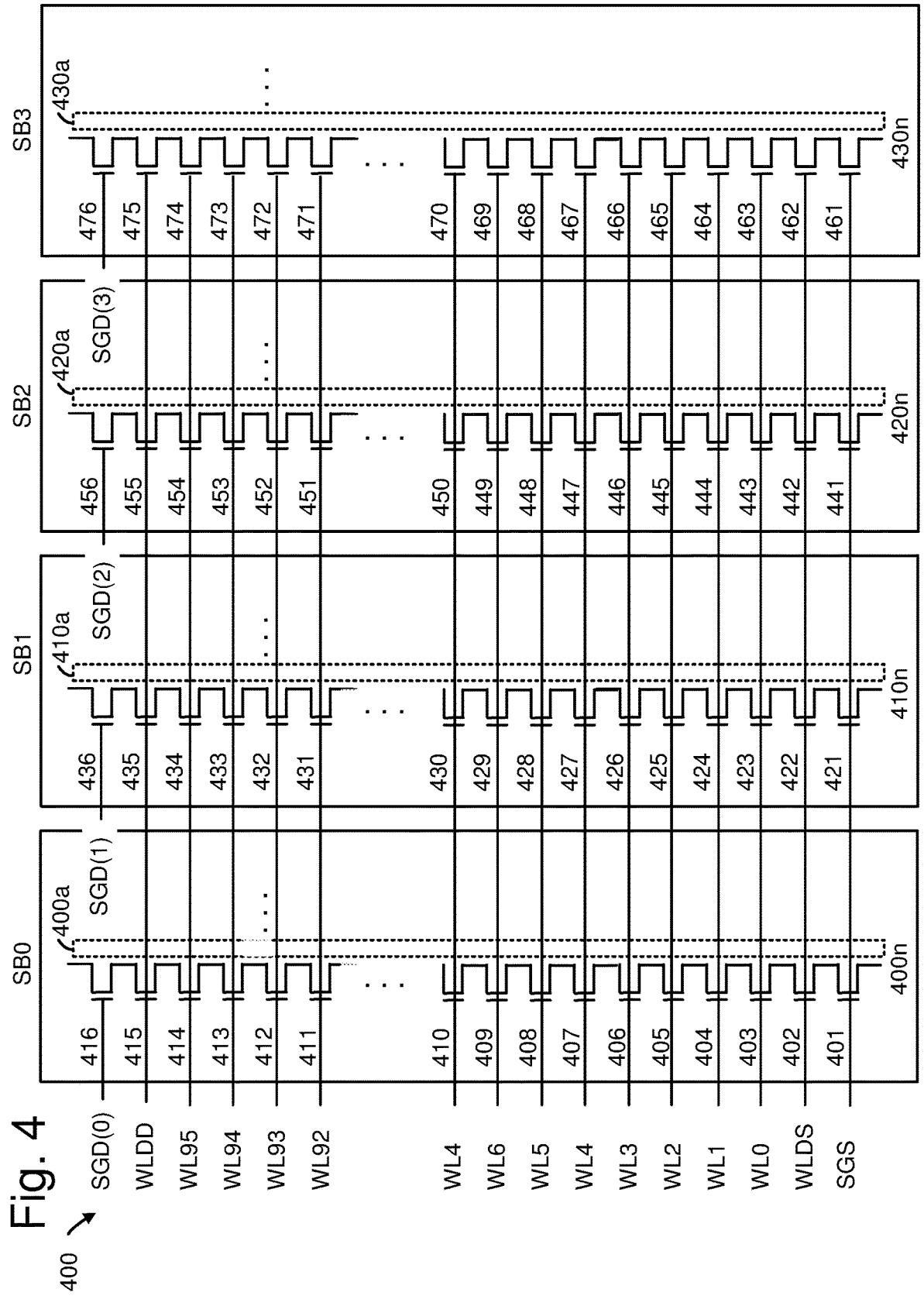

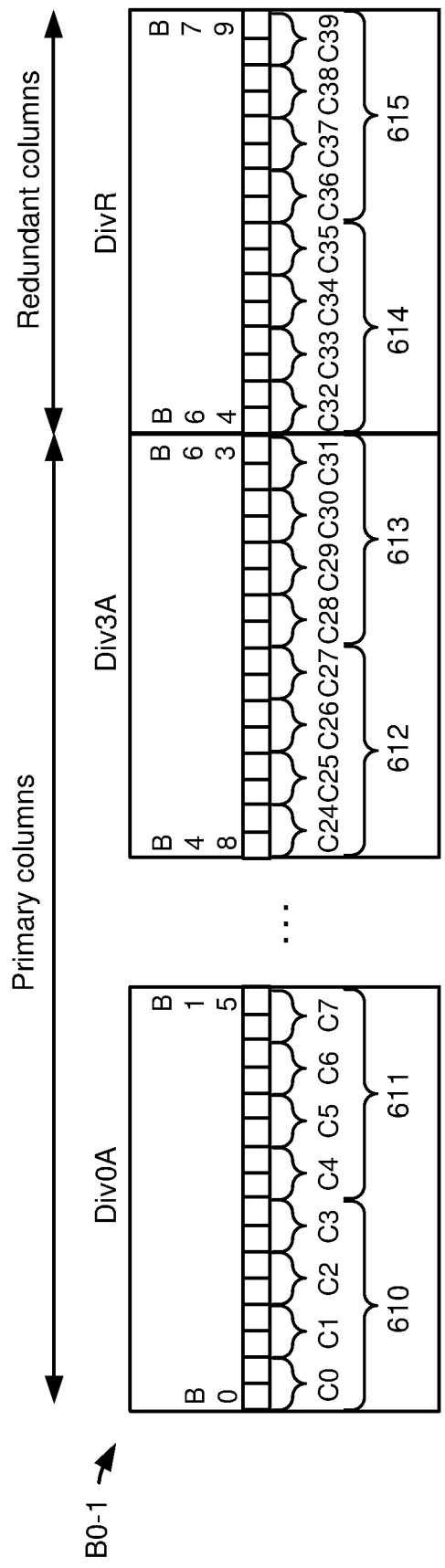

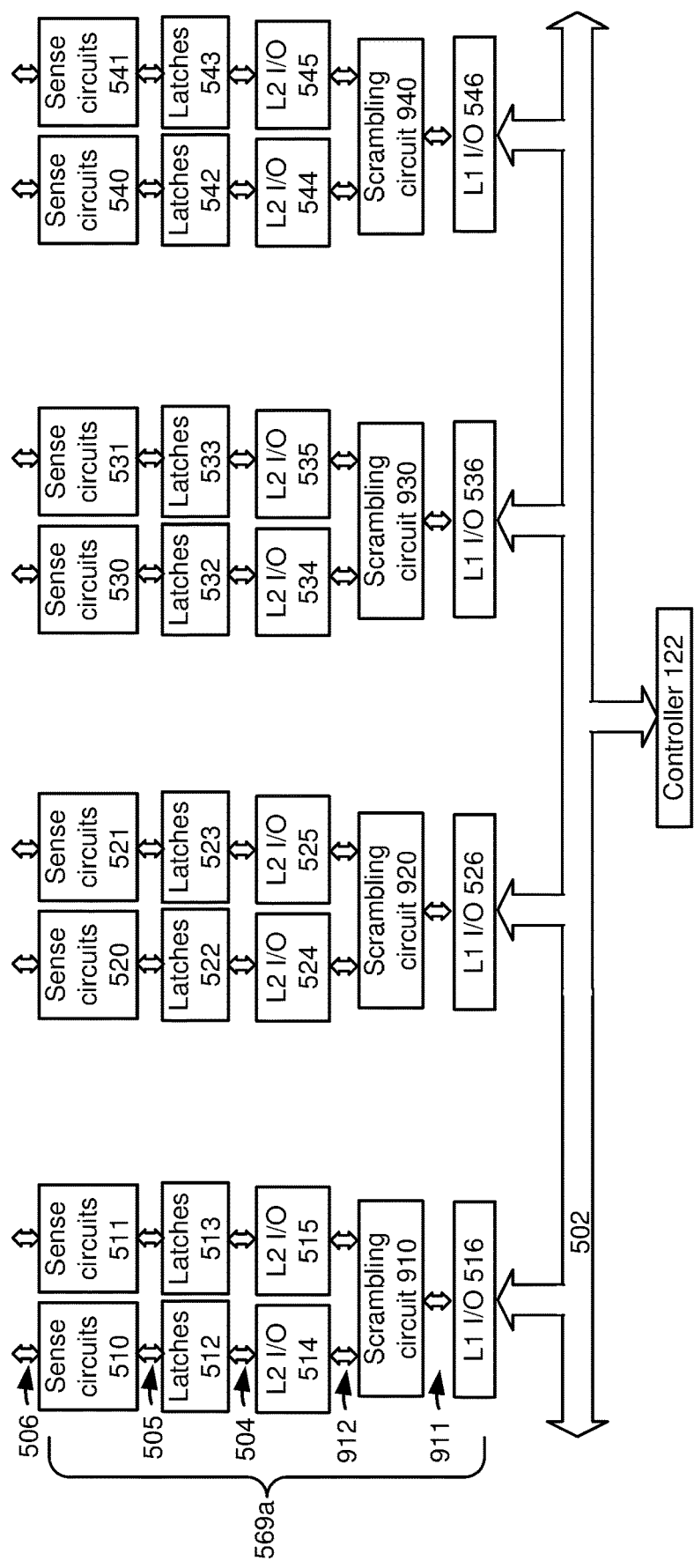

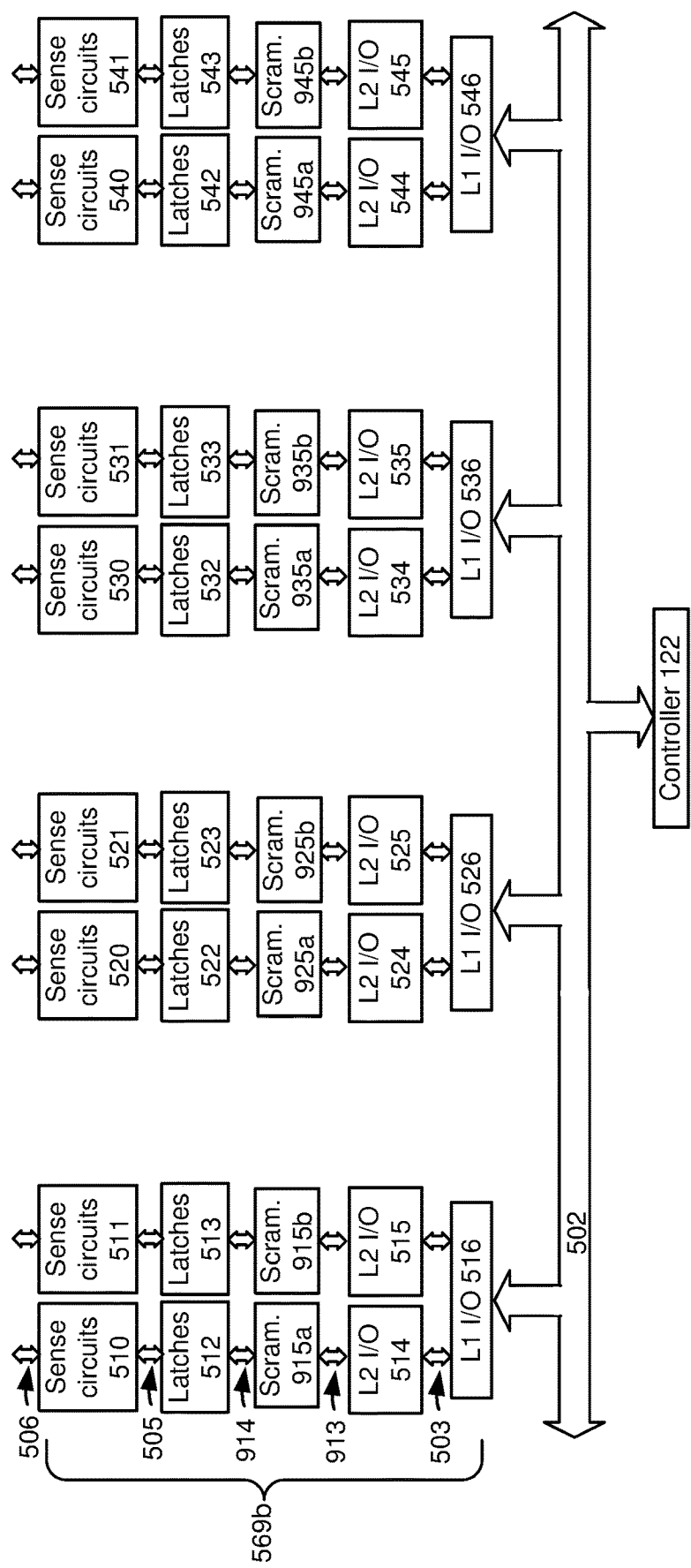

Fig. 10B

| Cycle | Data | Memory cells | Division |
|---|---|---|---|
| 1 | D0/E8 | B0/B1 | Div0 |
|  | D8/E0 | B16/B17 | Div1 |
|  | D0/E8 | B32/B33 | Div2 |
|  | D8/E0 | B48/B49 | Div3 |
| 2 | D1/E9 | B2/B3 | Div0 |
|  | D9/E1 | B18/B19 | Div1 |
|  | D1/E9 | B34/B35 | Div2 |
|  | D9/E1 | B50/B51 | Div3 |
| 3 | D2/E10 | B4/B5 | Div0 |
|  | D10/E2 | B20/B21 | Div1 |
|  | D2/E10 | B36/B37 | Div2 |
|  | D10/E2 | B52/B53 | Div3 |
| 4 | D3/E11 | B6/B7 | Div0 |
|  | D11/E3 | B22/B23 | Div1 |
|  | D3/E11 | B38/B39 | Div2 |
|  | D11/E3 | B54/B55 | Div3 |
| 5 | D4/E12 | B8/B9 | Div0 |
|  | D12/E4 | B24/B25 | Div1 |
|  | D4/E12 | B40/B41 | Div2 |
|  | D12/E4 | B56/B57 | Div3 |
| 6 | D5/E13 | B10/B11 | Div0 |
|  | D13/E5 | B26/B27 | Div1 |
|  | D5/E13 | B42/B43 | Div2 |
|  | D13/E5 | B58/B59 | Div3 |
| 7 | D6/E14 | B12/B13 | Div0 |
|  | D14/E6 | B28/B29 | Div1 |
|  | D6/E14 | B44/B45 | Div2 |
|  | D14/E6 | B60/B61 | Div3 |
| 8 | D7/E15 | B14/B15 | Div0 |
|  | D15/E7 | B30/B31 | Div1 |
|  | D7/E15 | B46/B47 | Div2 |
|  | D15/E7 | B62/B63 | Div3 |

Fig. 11B

| Cycle | Data | Memory cells | Division |
|---|---|---|---|
| 1 | D0/E4 | B0/B1 | Div0 |
|  | D8/E12 | B16/B17 | Div1 |
|  | D0/E4 | B32/B33 | Div2 |
|  | D8/E12 | B48/B49 | Div3 |
| 2 | D1/E5 | B2/B3 | Div0 |
|  | D9/E13 | B18/B19 | Div1 |
|  | D1/E5 | B34/B35 | Div2 |
|  | D9/E13 | B50/B51 | Div3 |
| 3 | D2/E6 | B4/B5 | Div0 |
|  | D10/E14 | B20/B21 | Div1 |
|  | D2/E6 | B36/B37 | Div2 |
|  | D10/E14 | B52/B53 | Div3 |
| 4 | D3/E7 | B6/B7 | Div0 |
|  | D11/E15 | B22/B23 | Div1 |
|  | D3/E7 | B38/B39 | Div2 |
|  | D11/E15 | B54/B55 | Div3 |
| 5 | D4/E0 | B8/B9 | Div0 |
|  | D12/E8 | B24/B25 | Div1 |
|  | D4/E0 | B40/B41 | Div2 |
|  | D12/E8 | B56/B57 | Div3 |
| 6 | D5/E1 | B10/B11 | Div0 |
|  | D13/E9 | B26/B27 | Div1 |
|  | D5/E1 | B42/B43 | Div2 |
|  | D13/E9 | B58/B59 | Div3 |
| 7 | D6/E2 | B12/B13 | Div0 |
|  | D14/E10 | B28/B29 | Div1 |
|  | D6/E2 | B44/B45 | Div2 |
|  | D14/E10 | B60/B61 | Div3 |
| 8 | D7/E3 | B14/B15 | Div0 |
|  | D15/E11 | B30/B31 | Div1 |
|  | D7/E3 | B46/B47 | Div2 |
|  | D15/E11 | B62/B63 | Div3 |

Fig. 12B

| Cycle | Data | Memory cells | Division |
|---|---|---|---|
| 1 | D0/E2 | B0/B1 | Div0 |
|   | D8/E10 | B16/B17 | Div1 |
|   | D0/E2 | B32/B33 | Div2 |
|   | D8/E10 | B48/B49 | Div3 |
| 2 | D1/E3 | B2/B3 | Div0 |
|   | D9/E11 | B18/B19 | Div1 |
|   | D1/E3 | B34/B35 | Div2 |
|   | D9/E11 | B50/B51 | Div3 |
| 3 | D2/E0 | B4/B5 | Div0 |
|   | D10/E8 | B20/B21 | Div1 |
|   | D2/E0 | B36/B37 | Div2 |
|   | D10/E8 | B52/B53 | Div3 |
| 4 | D3/E1 | B6/B7 | Div0 |
|   | D11/E9 | B22/B23 | Div1 |
|   | D3/E1 | B38/B39 | Div2 |
|   | D11/E9 | B54/B55 | Div3 |
| 5 | D4/E6 | B8/B9 | Div0 |
|   | D12/E14 | B24/B25 | Div1 |
|   | D4/E6 | B40/B41 | Div2 |
|   | D12/E14 | B56/B57 | Div3 |
| 6 | D5/E7 | B10/B11 | Div0 |
|   | D13/E15 | B26/B27 | Div1 |
|   | D5/E7 | B42/B43 | Div2 |
|   | D13/E15 | B58/B59 | Div3 |
| 7 | D6/E4 | B12/B13 | Div0 |
|   | D14/E12 | B28/B29 | Div1 |
|   | D6/E4 | B44/B45 | Div2 |
|   | D14/E12 | B60/B61 | Div3 |
| 8 | D7/E5 | B14/B15 | Div0 |
|   | D15/E13 | B30/B31 | Div1 |
|   | D7/E5 | B46/B47 | Div2 |
|   | D15/E13 | B62/B63 | Div3 |

Fig. 14A

| Unit of bad column Data | Calculated unit of error detection data |
|---|---|
| D0 | E0 |
| D1 | E1 |
| D2 | E2 |
| D3 | E3 |
| D4 | E4 |
| D5 | E5 |
| D6 | E6 |
| D7 | E7 |
| D8 | E8 |
| D9 | E9 |
| D10 | E10 |
| D11 | E11 |
| D12 | E12 |
| D13 | E13 |
| D14 | E14 |
| D15 | E15 |

Fig. 14B bit[7] = data[7] ^ data[5] ^ data[2] ^ data[0]
bit[6] = data[6] ^ data[5] ^ data[4] ^ data[2] ^ data[1] ^ data[0]
bit[5] = data[4] ^ data[3] ^ data[2] ^ data[1]
bit[4] = data[7] ^ data[3] ^ data[2] ^ data[1] ^ data[0]
bit[3] = ~( data[7] ^ data[6] ^ data[5] ^ data[1] )
bit[2] = ~( data[7] ^ data[6] ^ data[5] ^ data[4] ^ data[0] )
bit[1] = ~( data[7] ^ data[6] ^ data[4] ^ data[3] ^ data[2] ^ data[0] )
bit[0] = data[6] ^ data[3] ^ data[1] ^ data[0]

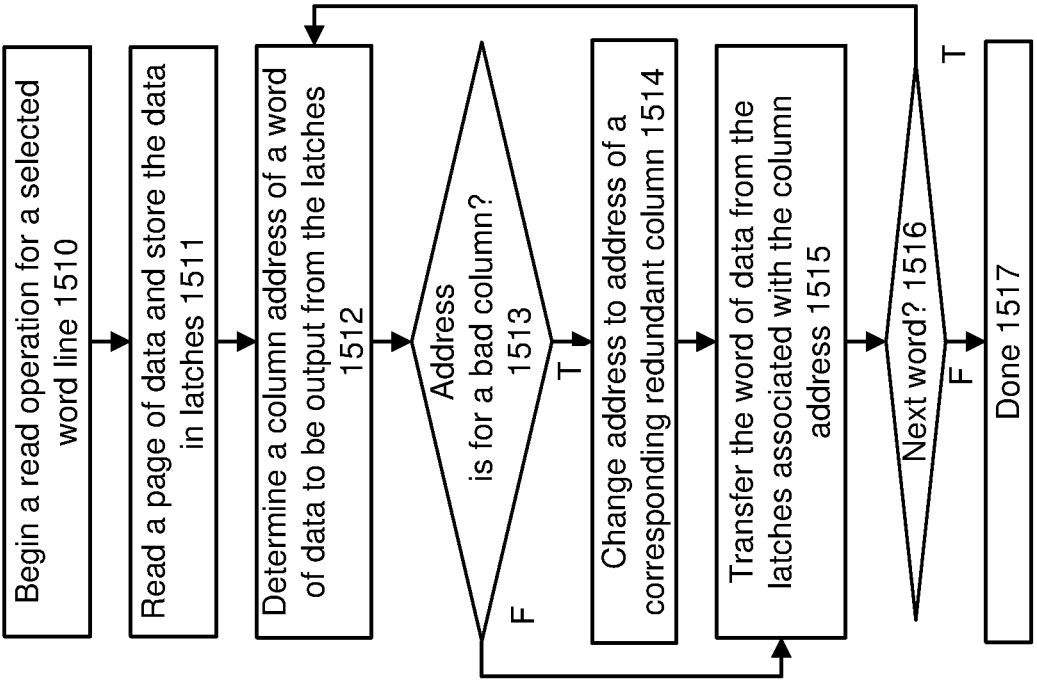
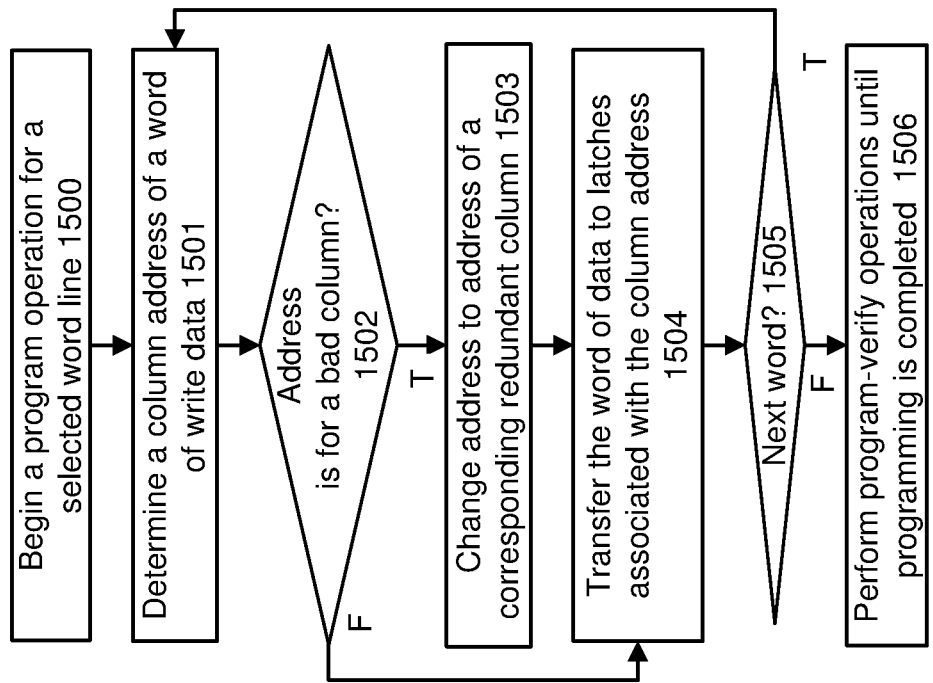

ROBUST STORAGE OF BAD COLUMN DATA AND PARITY BITS ON WORD LINE

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device can include memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 4 depicts an example view of NAND strings in a block 400 representing any of the blocks of FIG. 2.

FIG. 6 depicts an example configuration of the user data block B0-1 of FIG. 2, where the memory cells are arranged in divisions for primary columns and redundant columns.

FIG. 7 depicts an example of the column replacement table 147 of FIG. 1A, consistent with FIG. 6.

FIG. 9A depicts access circuitry 569a which is an alternative to the access circuitry 569 of FIG. 5A, where scrambling circuits are between the first and second level I/O circuits.

FIG. 9B depicts access circuitry 569b which is another alternative to the access circuitry 569 of FIG. 5A, where scrambling circuits are between the second level I/O circuits and the latches.

FIG. 10B depicts an example correspondence between bytes of memory cells and data units in the scrambled sequence of FIG. 10A, and an order of writing the scrambled sequence.

FIG. 11B depicts an example correspondence between bytes of memory cells and data units in the scrambled sequence of FIG. 11A, and an order of writing the scrambled sequence.

FIG. 12B depicts an example correspondence between bytes of memory cells and data units in the scrambled sequence of FIG. 12A, and an order of writing the scrambled sequence.

FIG. 14A depicts a table showing units of bad column data and related calculated units of error detection data, consistent with FIG. 13B, step 1312.

FIG. 14B depicts example equations for calculating a unit of error detection data for a unit of bad column data consistent with FIG. 13B, step 1312 and FIG. 14A.

FIG. 15A depicts an example process for performing a program operation for a selected word line in block of user data.

FIG. 15B depicts an example process for performing a read operation for a selected word line in block of user data, consistent with FIG. 15A.

DETAILED DESCRIPTION

Apparatuses and techniques are described for reliably storing bad column data in a memory device.

In some memory devices, memory cells are joined to one another such as in NAND strings in a block or sub-block. Referring to FIG. 4, for example, each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

Each block of memory cells is typically tested at the time of manufacture, before being shipped to the end user, to identify defective (bad) NAND strings which are not suitable for storing data. Defects, including, e.g., short circuits, can be caused by manufacturing variations and other factors. To address this problem without having to discard an entire block when only one, or a few, NAND strings are defective, a block can include a number of redundant columns of NAND strings which substitute for defective primary columns of NAND strings. A column can represent a set of successive NAND strings such as 16 NAND strings. The memory cells connected to a word line in a column can store a word of data. As depicted in FIG. 6, for example, a block B0-1 for storing user data can include primary columns C0-C31 and redundant columns C32-C39. If the testing indicates that a primary column of NAND strings include a defective NAND string, that column is identified in a column replacement table 147 (FIGS. 1A and 7) so that it is replaced by a redundant column.

Figure 5A:
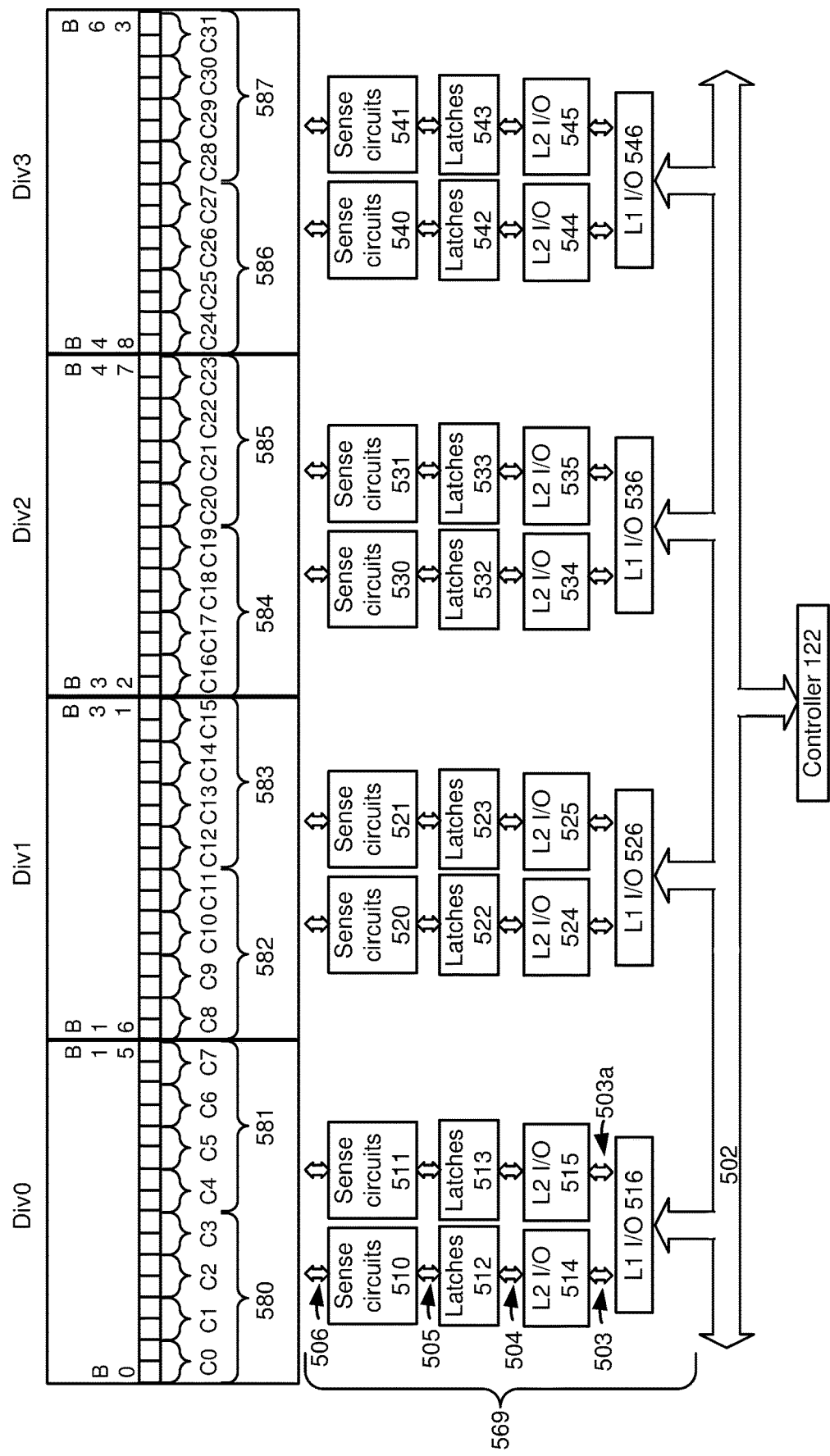
FIG. 5A depicts an example configuration of the bad column data block B0-0 of FIG. 2 and associated access circuitry 569, where the memory cells are arranged in divisions.

The data which identifies the bad column can be stored in a bad column block. As depicted in FIG. 5A, for example, a block B0-0 for storing bad column can include primary columns C0-C31. A bad column block is considered to be a read-only memory (ROM) because the data is typically maintained in the block over the lifetime of the memory device and is not altered. When the memory device is powered on, the bad column data is read in by a controller and used to provide the column replacement table. Subsequently, the column replacement table is accessed during read and write operations.

Moreover, to improve reliability, one approach is to store the bad column data with parity bits. In this approach, when the bad block data is read, the parity bits are calculated from the bad column data and compared to parity bits which are stored in the ROM. If there is a match between the two sets of parity bits, the unit of bad column data is validated. If there is a mismatch between the two sets of parity bits, the unit of bad column data is considered to be bad. The parity bits are one example of error detection data.

However, the bad column data and/or parity bits which are read from the ROM can sometimes be faulty. Faults can be caused by various factors including temperature variations, weak short circuits, weak open circuits and changes in resistivity of the semiconductor materials in the memory device. In some cases, a fault is caused by improper operation of transistors in a sense circuit. A fault which is not present at the time of manufacture can develop over the lifetime of a memory device. A fault can occur with the bad column data and/or the parity bits, making it impossible to accurately validate the bad column data. For example, an error in the unit of error detection data can result in a mismatch between the two sets of parity bits when the unit of bad column data is not erroneous, or in a match between the two sets of parity bits when the unit of bad column data is erroneous.

Moreover, a fault can affect both a bad ROM block and user data blocks.

Techniques provided herein address the above and other issues. In one approach, units of bad column data and related units of error detection data are stored in non-adjacent groups of memory cells connected to a word line in the ROM block. One or more word lines can be used. A unit of error detection data is related to a unit of bad column data when the unit of error detection data is calculated from the unit of bad column data, e.g., using an error detection code.

For example, the error detection data may comprise parity bits, as mentioned. Additionally, multiple copies of the units of bad column data and related units of error detection data are stored in memory cells connected to the word line. A unit of bad column data and a related unit of error detection data can be stored in respective groups of memory cells which are relatively far apart from one another along the word line. This helps ensure that a defect in a few neighboring NAND strings will not affect both the unit of bad column data and the related unit of error detection data. If the unit of bad column data is stored in defective NAND strings, the read back unit of bad column data and the corresponding calculated error detection data will be faulty. When the faulty unit of calculated error detection data is compared to the reference unit of error detection data which is read back from the ROM block, there will be a mismatch.

When a mismatch is detected, an attempt can be made to read the unit of bad column data and the related unit of error detection data from another copy of the data from the memory cells connected to the word line.

In another aspect, a unit of bad column data and a related unit of error detection data can be stored using different input/output circuits. This helps provide additional reliability since a defect in one input/output circuit will not affect the operation of the other input/output circuit.

In another aspect, there are first level (L1) input/output circuits and second level (L2) input/output circuits, such as in FIG. 5A. A unit of bad column data and a related unit of error detection data can be stored using a common first level input/output circuit but different second level input/output circuits, as in FIG. 12A. Or, a unit of bad column data and a related unit of error detection data can be stored using different first level input/output circuits, as in FIG. 11A.

In another aspect, a sequence of data is scrambled, where the sequence comprises units of bad column data adjacent to related units of error detection data. The sequence can be scrambled over a full length of the sequence, such as in FIG. 10A, or over a portion of the sequence which is less than the full length. For example, the sequence can be scrambled over a half-length of the sequence, such as in FIG. 11A, or over a quarter length of the sequence, such as in FIG. 12A.

Figure 1A:
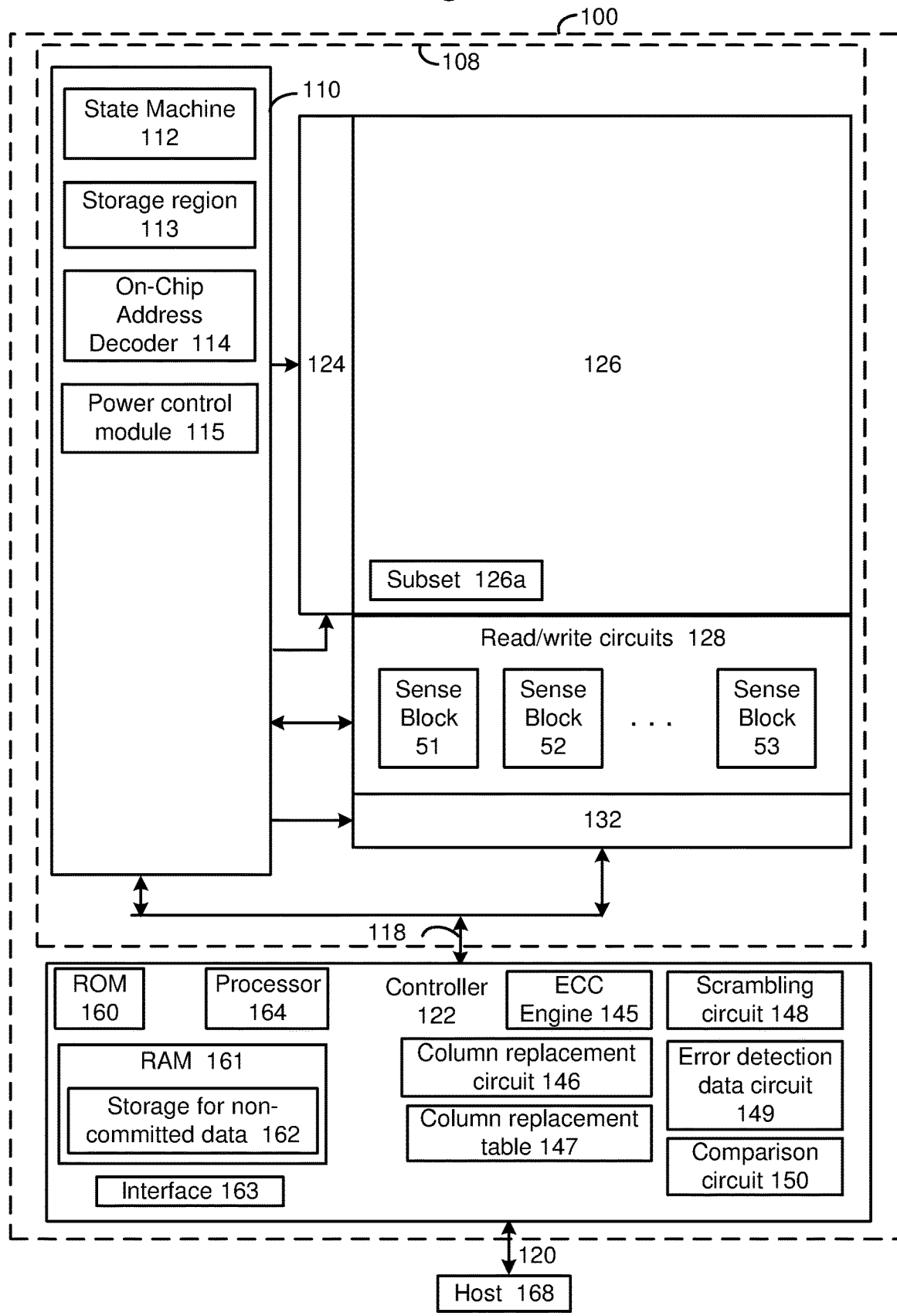
FIG. 1A is a block diagram of an example storage device.

The scrambling can be performed at a controller, e.g., in the scrambling circuit 148 of FIG. 1A, at a first level of I/O circuits, e.g., in the scrambling circuits 910, 920, 930 and 940 in FIG. 9A, and/or at a second level of I/O circuits, e.g., in the scrambling circuits 915a, 915b, 925a, 925b, 935a, 935b, 945a and 945b in FIG. 9B. The scrambling circuit may have circuitry such as a multiplexer and demultiplexer for rearranging data units.

In another aspect, the memory cells of the ROM block are provided in divisions, where the controller performs read and write operations one division at a time in cycles. This helps ensure that a unit of bad column data and a related unit of error detection data are stored relatively far apart from one another on a word line. For example, a respective group of memory cells to which a unit of bad column data is written can be separated (by a separation distance dented by the arrow 1022 in FIG. 10A) from a respective group of memory cells to which the related unit of error detection data is written by at least 10% of a length of the word line (the length is denoted by the arrow 1021 in FIG. 10A). The separation can be at least 1/Nth of the length of the word line when there are N divisions of memory cells along the word line. N is a number greater than one.

These and other features are discussed further below.

FIG. 1A is a block diagram of an example storage device. A memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 168 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control module 115 (power control circuit). A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, sense blocks 51, 52, . . . , 53, read/write circuits 128, controller 122, and so forth.

The off-chip controller 122 (which in one embodiment is an electrical circuit) may comprise a processor 164, memory such as ROM 160 and RAM 161 and an error-correction code (ECC) engine 145. The ECC engine can correct a number of read errors. The RAM 161 can be a DRAM which includes a storage location 162 for non-committed data. During programming, a copy of the data to be programmed is stored in the storage location 162 until the programming is successfully completed. In response to the successful completion, the data is erased from the storage location and is committed or released to the block of memory cells. The storage location 162 may store one or more word lines of data.

The controller may further include a column replacement circuit 146 and a column replacement table 147. The column replacement circuit may include hardware, software and/or firmware for performing the processes described herein. In program and read operations, the column replacement circuit may access the column replacement table to identify addresses of bad, e.g., defective, columns and corresponding redundant columns which replace them.

The controller may further include a scrambling circuit 148 which can be used to scramble a sequence of data units in a write operation so that bad column data units are not adjacent to related units of error detection data in the groups of memory cell in which the units are written. The scrambling circuit can also be used in a reverse process, to unscramble a sequence of data units so that bad column data units are adjacent to related units of error detection data in a read operation. The scrambling circuit 148 can include a multiplexer and demultiplexer for rearranging data units as described herein.

The controller may further include an error detection data circuit 149 which can be used to generate units of error detection data from respective units of bad column data.

The controller may further include a comparison circuit 150 which can be used to compare calculated units of error detection data which are calculated from units of bad column data which are read back from the ROM block to reference units of error detection data which are read back from the ROM block. If a mismatch is detected for a unit of bad column data, the validation fails. If a mismatch is not detected for a unit of bad column data, the validation is successful.

A memory interface 163 may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 163.

The memory in the controller 122, such as such as ROM 160 and RAM 161, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 164 fetches the boot code from the ROM 160 or the subset 126a for execution, and the boot code initializes the system components and loads the control code into the RAM 161. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure. In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
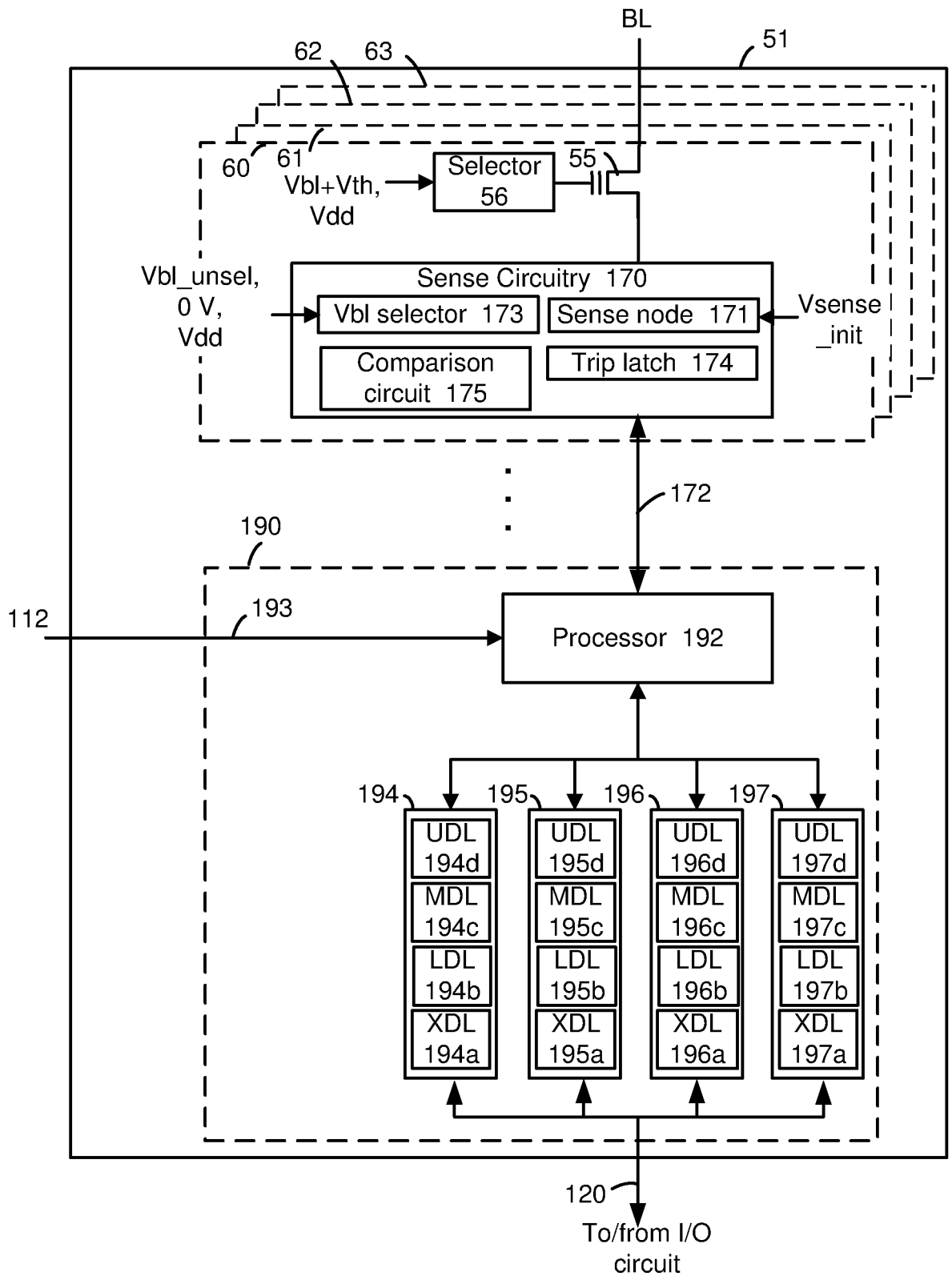
FIG. 1B is a block diagram depicting one embodiment of the sense block 51 of FIG. 1.

FIG. 1B is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits.

During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and a data bus 120 to/from an I/O circuit. For each NAND string, a set of data latches can be provided for storing read and write data while an additional input/output latch XDL, or data transfer latch, is provided for transferring data to/from the other latches. The XDL latches may be represented by the latches 512, 513, 522, 523, 532, 533, 542 and 543 of FIGS. 5A, 9A and 9B.

For example, in a three bit per cell embodiment, three data latches LDL, MDL and XDL are provided for storing read and write data for each NAND string. LDL stores a bit for a lower page of data, MDL stores a bit for a middle page of data and UDL stores a bit for an upper page of data. For example, a set of latches 194 includes XDL 194a, LDL 194b, MDL 194c and UDL 194d. A set of latches 195 includes XDL 195a, LDL 195b, MDL 195c and UDL 195d. A set of latches 196 includes XDL 196a, LDL 196b, MDL 196c and UDL 196d. A set of latches 197 includes XDL 197a, LDL 197b, MDL 197c and UDL 197d.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program operations for memory cells of a user data block, the data to be programmed (write data) is stored in the set of data latches 194-197 from the data bus 120, in a three bit per cell example. During program operations for memory cells of a ROM block, the units of bad blocks data and error detection data are to be programmed are stored in one latch in the set of data latches 194-197 in a one bit per cell example.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are four data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 2:
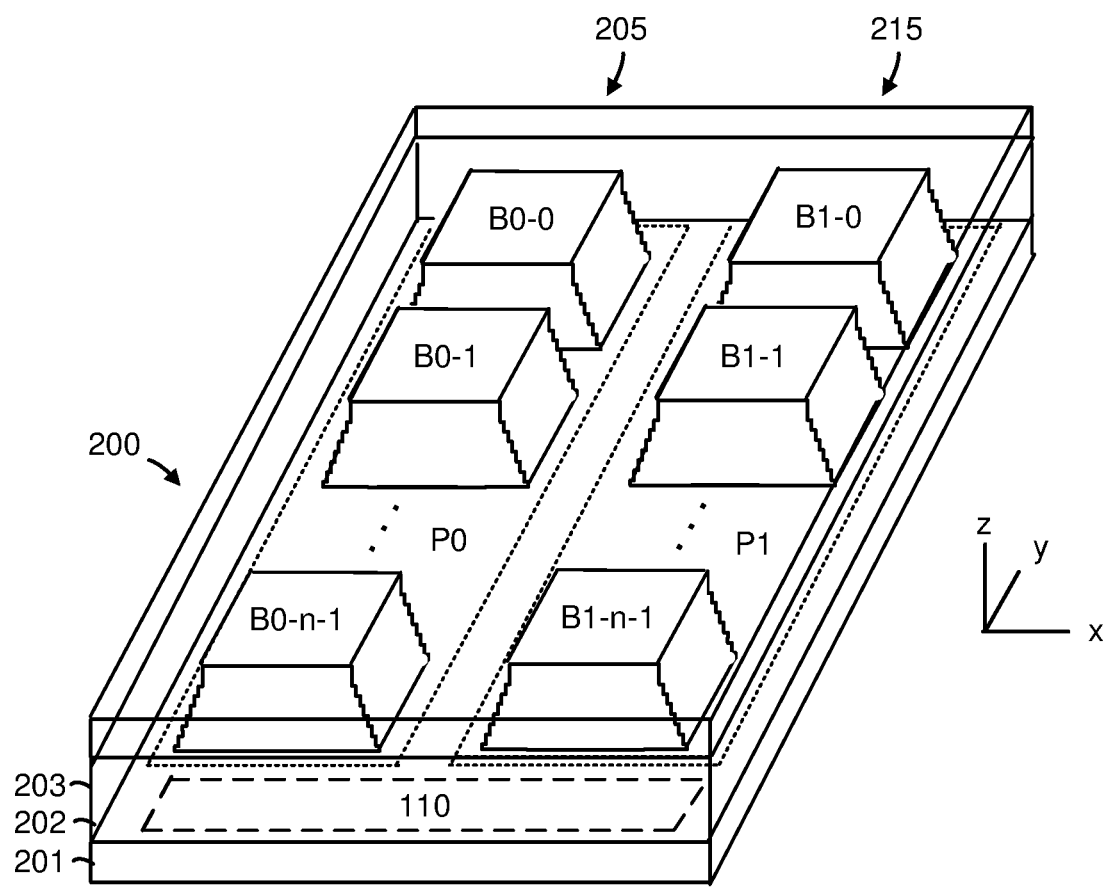
FIG. 2 is a perspective view of an example memory die 200 in which of blocks are provided in respective planes P0 and P1, consistent with FIG. 1A.

FIG. 2 is a perspective view of an example memory die 200 in which of blocks are provided in respective planes P0 and P1, consistent with FIG. 1A. The memory die includes a substrate 201, an intermediate region 202 in which blocks of memory cells are formed, and an upper region 203 in which one or more upper metal layers are patterned such as to form bit lines. Planes P0 and P1 represent respective isolation regions which are formed in the substrate 201. Further, a first block sequence 205 of a number n blocks, labelled B0-0 to B0-*n*-1, are formed in P0, and a second block sequence 215 of a number n blocks, labelled B1-0 to B1-*n*-1, are formed in P1. Each plane may have associated row and column control circuitry, such as the row decoder 124, read/write circuits 128 and column decoder 132 of FIG. 1A.

In one approach, each sequence of blocks include one ROM block, or bad column block, for storing bad column data while remaining blocks are used to store user data. The bad column block is considered to be a read-only memory (ROM) block because the data is typically maintained in the block over the lifetime of the memory device and is not altered. Moreover, copies of the bad column data may be stored in one block in each block sequence. For example, blocks B0-0 and B1-0 may store bad column data. Further, the bad column data in a block may apply to the all blocks on the die, e.g., so that the blocks B0-0 and B1-0 both store the same bad column data for the user data blocks B0-1 to B0-*n*-1 and B1-1 to B1-*n*-1. Or, the bad column data in the ROM block of a plane may apply to the user data blocks in that plane.

The control circuitry 110, which may be located in a peripheral area of the die, may be shared among the planes, in one approach. Each plane may have a separate set of bit lines.

By providing blocks of memory cells in multiple planes, parallel operations can be performed in the planes.

The substrate 201 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 3:
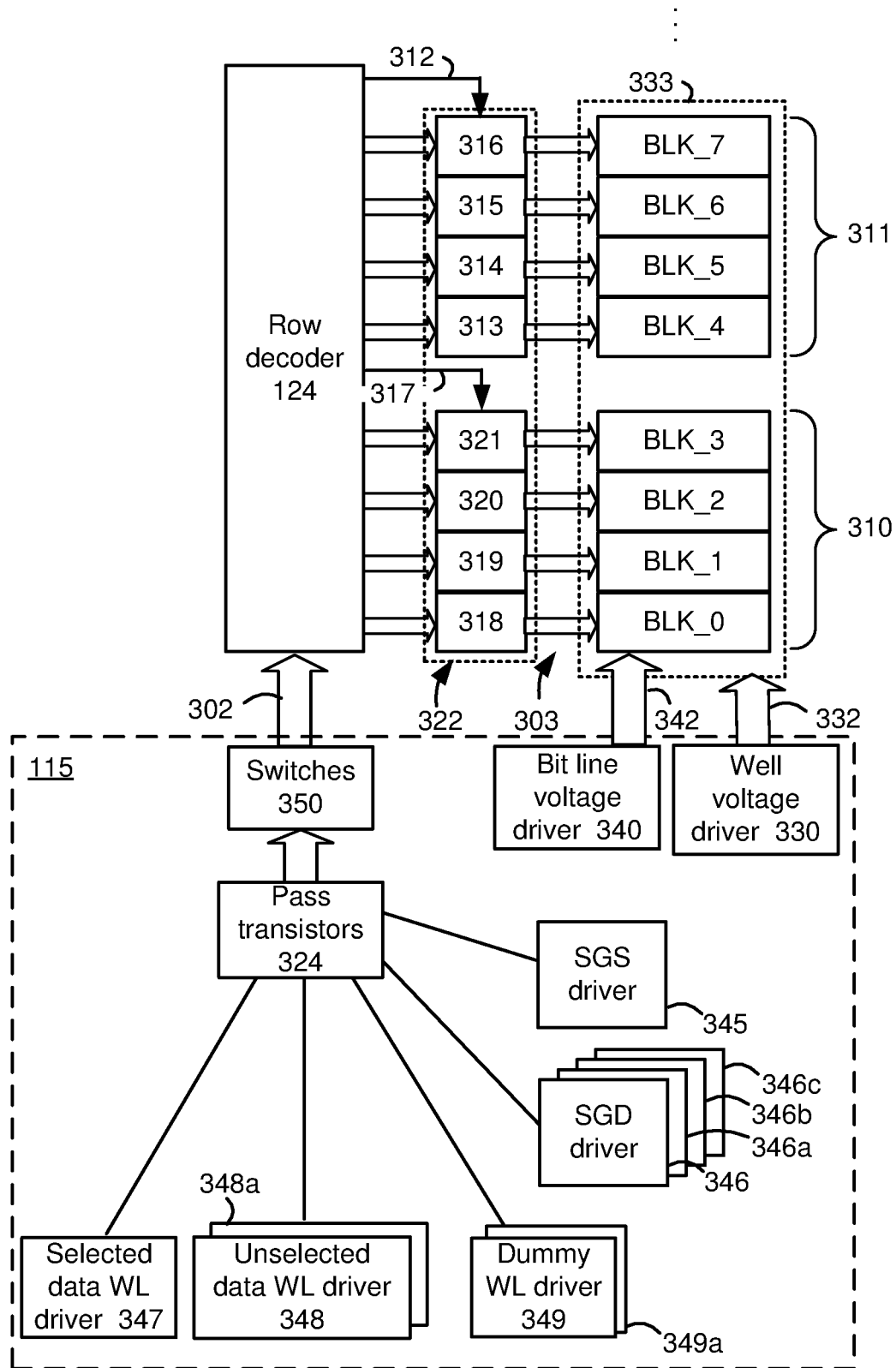
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 310 of four related blocks, BLK_0 to BLK_3, and another set 311 of four related blocks, BLK_4 to BLK_7. The blocks can be in one or more planes. The row decoder 124 of FIG. 1A provides voltages to word lines and select gates of each block via pass transistors 322. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313, 314, 315 and 316, which in turn are connected to control gate lines of BLK_4, BLK_5, BLK_6 and BLK_7, respectively. A control gate line 317 is connected to sets of pass transistors 318, 319, 320 and 321, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a voltage on WLn. Drivers 348, 348a, 348b and 348c can be used for unselected data word lines, and dummy word line drivers 349 and 349a can be used to provide voltages on dummy word lines WLDD and WLDS, respectively, in FIG. 4. For example, the driver 348 can be used to apply voltages to the drain-side unselected word lines and the driver 348a can be used to apply voltages to the source-side unselected word lines.

The voltage drivers can also include separate SGD drivers for each sub-block. For example, SGD drivers 346, 346a, 346b and 346c can be provided for SB0, SB1, SB2 and SB3, respectively, such as in FIG. 4. In one option, an SGS driver 345 is common to the different sub-blocks in a block.

The various components, including the row decoder, may receive commands from a controller such as the state machine 112 or the controller 122 to perform the functions described herein.

The well voltage driver 330 provides a voltage Vs1 to a well region 333 in the substrate, via control lines 332. The well voltage driver 330 is one example of a source line driver, where the well region is a source line, e.g., a conductive path connected to the source ends of the NAND strings. In one approach, the well region is common to the blocks. A set of bit lines 342 is also shared by the blocks. A bit line voltage driver 340 provides voltages to the bit lines. In a stacked memory device sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

FIG. 4 depicts an example view of NAND strings in a block 400 representing any of the blocks of FIG. 2. The block 400 comprises a plurality of memory cells. The primary NAND strings are arranged in sub-blocks of the block in a 3D configuration. Each sub-block includes multiple NAND strings, where one example NAND string is depicted. For example, SB0, SB1, SB2 and SB3 comprise example NAND strings 400n, 410n, 420n and 430n, respectively. The NAND strings have data word lines, dummy word lines and select gate lines. Each sub-block comprises a set of NAND strings which extend in the x direction and which have a common SGD line or control gate layer. The NAND strings 400n, 410n, 420n and 430n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 400n, 410n, 420n and 430n have channels 400a, 410a, 420a and 430a, respectively. Additionally, NAND string 400n includes SGS transistor 401, dummy memory cell 402, data memory cells 403-414, dummy memory cell 415 and SGD transistor 416. NAND string 410n includes SGS transistor 421, dummy memory cell 422, data memory cells 423-434, dummy memory cell 435 and SGD transistor 436. NAND string 420n includes SGS transistor 441, dummy memory cell 442, data memory cells 443-454, dummy memory cell 455 and SGD transistor 456. NAND string 430n includes SGS transistor 461, dummy memory cell 462, data memory cells 463-474, dummy memory cell 475 and SGD transistor 476.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 5A depicts an example configuration of the bad column data block B0-0 of FIG. 2 and associated access circuitry 569, where the memory cells are arranged in divisions. Since a block can typically include thousands of NAND strings, it is convenient to divide the block into divisions. Each division in turn includes many columns, where a column is a group of word lines corresponding to a unit of data such as a word. For example, with a 16-bit word, there are 16 NAND strings in a column In this example, there are four divisions, Div0-Div3, which include columns C0-C7, C8-C15, C16-C23 and C24-C31, respectively. Further, each column includes two bytes of memory cells, e.g., 16 memory cells connected to a word line. For example, Div0, Div1, Div2 and Div3 include bytes B0-B15, B16-B31, B32-B47 and B48-B63, respectively.

Program or write operations can be performed by transferring data from the controller to the latches one division at a time in successive cycles. For example, in a first cycle, a word or two bytes of data can be transferred to latches for C0 in Div0. The next word can then be transferred to latches for C8 in Div1. The next word can then be transferred to latches for C16 in Div2. The next word can then be transferred to latches for C24 in Div3. In a second cycle, words can be transferred to latches for C1, C9, C17 and C25, and so forth. Once all of the write data has been transferred to the latches, the memory cells can be programmed.

Similarly, read operations can be performed by transferring data to the controller from the latches one division at a time. Initially, read data is stored in each of the latches. In a first cycle, a word of data can be transferred from latches for C0 in Div0 to the controller. The next words can then be transferred from latches for C8, C16 and C24. In a second cycle, words can be transferred from latches for C1, C9, C17 and C25, and so forth.

This approach allows for greater parallelism which reduces program and read time. Parallelism can also be improved by providing multiple levels of input/output circuits. In this example, the access circuitry 569 for the block includes two levels of input/output circuits, e.g., a first level L1 and a second level L2. The first level includes a first set of input/output circuits 516, 526, 536 and 546, with one input/output circuit per division, and the second level includes a second set of input/output circuits 514, 515, 524, 525, 534, 535, 544 and 545, with two input/output circuits per division. This is an example of a pipeline in which two units of data are received by one L1 input/output circuit and transferred to two L2 input/output circuits, one unit per L2 input/output circuit. That is, one half of the data is handled by one L2 input/output circuit and the other half is handled by another L2 input/output circuit.

Each L2 I/O circuit is associated with, and connected to, a set of input/output latches such as the XDL latches discussed previously. For example, the L2 input/output circuits 514, 515, 524, 525, 534, 535, 544 and 545 are associated with sets of latches 512, 513, 522, 523, 532, 533, 542 and 543, respectively, which in turn are associated with, and connected to, sets of sense circuits 510, 511, 520, 521, 530, 531, 540 and 541, respectively.

The L1 I/O circuits are connected to the L2 I/O circuits via paths such as data buses. For example, the L1 I/O circuit 516 is connected to the L2 I/O circuits 514 and 515 via paths 503 and 503a, respectively.

The L2 I/O circuits are connected to the latches via paths such as buses. For example, the L2 I/O circuit 514 is connected to the latches 512 via a path 504.

The latches are connected to the sense circuits via paths such as buses. For example, the latches 512 are connected to the sense circuits 510 via a path 505.

The sense circuits are connected to the NAND strings of a division via bit lines. For example, the sense circuits 510 are connected to the NAND strings of Div0 via bit lines 506.

Subsets 580-587 of columns in the divisions, comprising columns C0-C3, C4-C7, C8-C11, C12-C15, C16-C19, C20-C23, C24-C27 and C28-C31 are depicted. The L2 I/O circuit 514, latches 512 and sense circuits 510 may be used for writing to, and reading from, the subset 580. The L2 I/O circuit 515, latches 513 and sense circuits 511 may be used for writing to, and reading from, the subset 581. The L2 I/O circuit 524, latches 522 and sense circuits 520 may be used for writing to, and reading from, the subset 582. The L2 I/O circuit 525, latches 523 and sense circuits 521 may be used for writing to, and reading from, the subset 583. The L2 I/O circuit 534, latches 532 and sense circuits 530 may be used for writing to, and reading from, the subset 584. The L2 I/O circuit 535, latches 533 and sense circuits 531 may be used for writing to, and reading from, the subset 585. The L2 I/O circuit 544, latches 542 and sense circuits 540 may be used for writing to, and reading from, the subset 586. The L2 I/O circuit 545, latches 543 and sense circuits 541 may be used for writing to, and reading from, the subset 587.

The L1 I/O circuits and L2 I/O circuits may include hardware, software and/or firmware for performing the processes described herein. For example, in a program operation, the L1 I/O circuit 516 may have circuitry for receiving, e.g., a word or two bytes of write data, from the controller 122 via a bus 502, and transferring, in parallel, a first byte to the L2 I/O circuit 514 and a second byte to the L2 I/O circuit 515. For example, for each word, one byte may be a unit of bad column data and the other byte may be a unit of error detection data. A related method can include receiving the unit of bad column data and the unit of error detection data at a common input/output circuit 516, transferring the unit of bad column data from the common input/output circuit to one input/output circuit 514, and transferring the unit of error detection data from the common input/output circuit to another input/output circuit 515.

The second level I/O circuits may transfer data at half the rate of the first level I/O circuit. The data rate of an I/O circuit can be set by using a corresponding clock signal to transfer data. The L2 I/O circuit 514 may have circuitry, such as a multiplexer/demultiplexer, for receiving a byte of write data from the L1 I/O circuit via a path 503 at a first, higher data rate, and transferring bits of the byte to respective latches in the set of latches 512 at a second, lower data rate.

The transfer of the words at the lower data rate from an L1 I/O circuit to multiple L2 I/O circuits for a division can occur while the L1 I/O circuits of other divisions receive data. In a program operation, the write data can be distributed in a round robin manner, with one portion of write data per division. After each division has received a portion of write data from the controller, the next division is selected and so on, in repeated cycles.

In a read operation, the L2 I/O circuits for a division transfer read data from the sense circuits to the associated L1 I/O circuit at the second data rate. The L1 I/O circuit then transfers the read data to the controller via the bus at the first data rate.

This approach allows the controller to exchange data with the high level L1 I/O circuits at a relatively high speed while the transfer speed can be reduced within the lower level circuitry such as the latches, which is closer to the memory cells, to allow the use of scaled down components.

In a read operation, the read data can be transferred from the sense circuits to the L1 I/O circuits in a round robin manner, with one unit per division. After each division has transferred a unit of read data to the controller, the next division is selected and so on, in repeated cycles.

In another option, a single level of input/output circuits, with one input/output circuit per division, is provided.

Figure 5B:
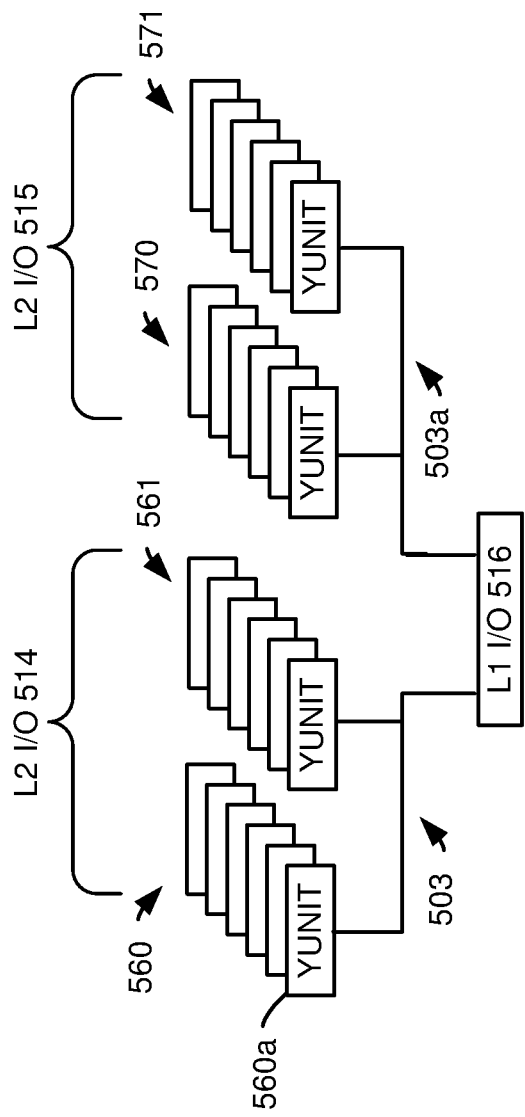
FIG. 5B depicts an example configuration of the L1 I/O circuit 516 and the associated L2 I/O circuits 514 and 515 of FIG. 5A.

FIG. 5B depicts an example configuration of the L1 I/O circuit 516 and the associated L2 I/O circuits 514 and 515 of FIG. 5A. The L2 I/O circuit 514 comprises two sets of components referred to a YUNIT. A first set of YUNITS 560 includes an example YUNIT 560a. A second set of YUNITs 561 is also shown. Each YUNIT is connected to latches of multiple NAND strings. The first and second sets of YUNITs communicate with the L1 I/O circuit 516 via the path 503. The L2 I/O circuit 515 similarly comprises first and second sets of YUNITs 570 and 571, respectively, which communicate with the L1 I/O circuit 516 via the path 503a. In another approach, more than two sets of YUNITs are used for each L2 I/O circuit.

FIG. 6 depicts an example configuration of the user data block B0-1 of FIG. 2, where the memory cells are arranged in divisions for primary columns and redundant columns A user data block can be divided into primary columns or divisions, e.g., Div0A-Div3A, and redundant columns or divisions, e.g., DivR. A primary column is a column which does not replace a defective column but is intended to be used to store data as long as it is not defective. A redundant column replaces a defective primary column. A primary column can be deemed defective if one or more of its NAND strings are defective, in one approach. The number of redundant columns is typically much less than the number of primary columns, e.g., <1% of the number of primary columns.

In this example, the subsets 610-615 of memory cells and columns may be accessed by respective sense circuits, latches and I/O circuits, similar to the access circuitry 569 of FIG. 5A. A column replacement table such as depicted in FIG. 7 can be used to identify redundant columns which replace defective primary columns.

FIG. 7 depicts an example of the column replacement table 147 of FIG. 1A, consistent with FIG. 6. The table indicates that the bad columns are C27 and C28 and the corresponding redundant columns which are used as substitutes are C32 and C33. See also FIG. 8.

Figure 8:
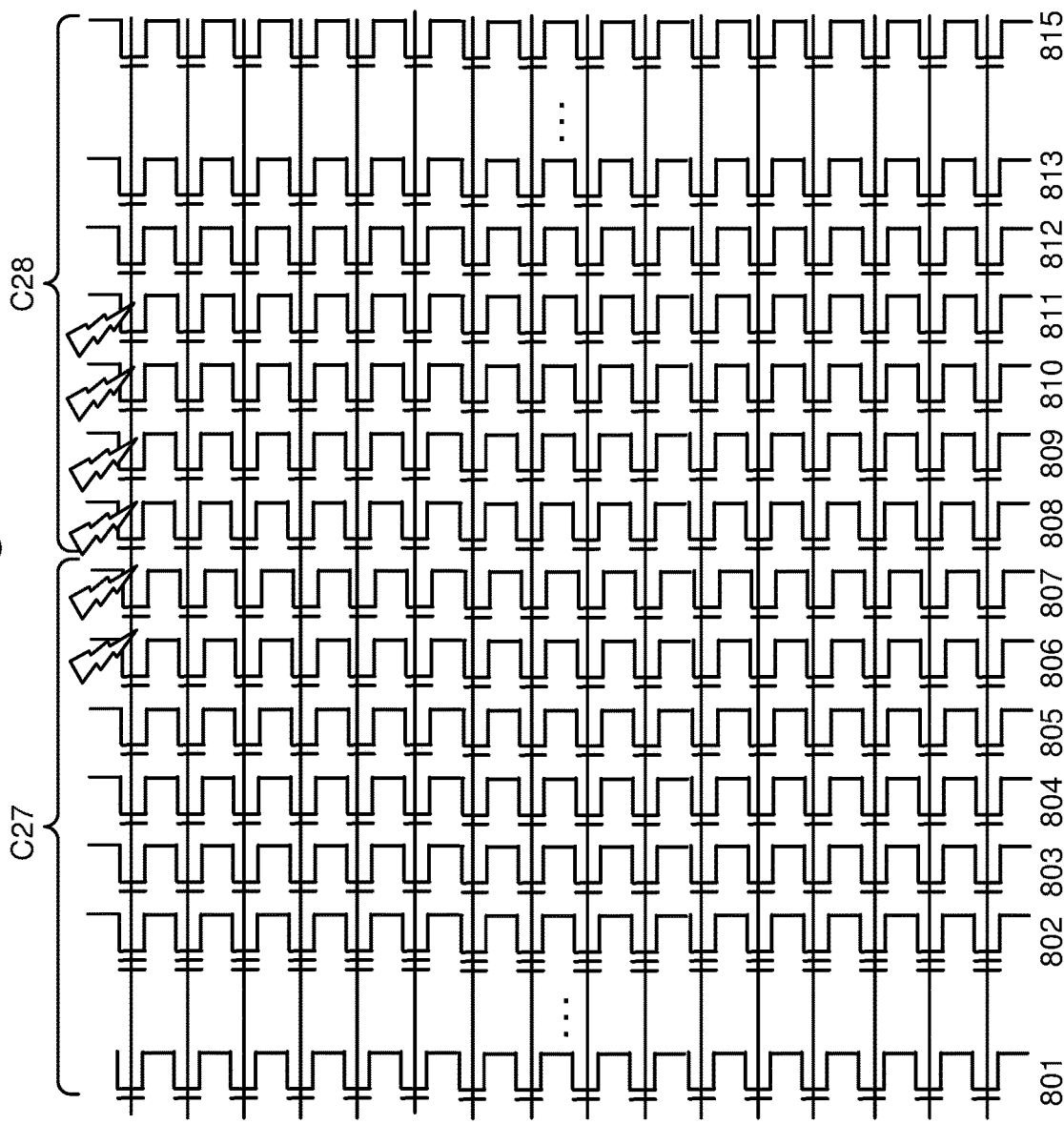
FIG. 8 depicts an example of bad columns C27 and C28 in the block of FIG. 6, consistent with FIG. 7.

FIG. 8 depicts an example of bad columns C27 and C28 in the block of FIG. 6, consistent with FIG. 7. A column can include 2 bytes or 16 NAND strings, for example. C27 includes NAND strings 801-807 and C28 includes NAND strings 808-815. In this example, six consecutive NAND strings, 806-811 are defective. The defect is indicated by the lightning bolts which can represent a short circuit or open circuit, for instance. Further, the defective NAND strings encompass the two adjacent columns. If a unit of bad column data was stored in C27 and the related unit of error detection data was stored in C28 in the defective NAND strings, an attempt to validate the unit of bad column data would likely fail.

FIG. 9A depicts access circuitry 569a which is an alternative to the access circuitry 569 of FIG. 5A, where scrambling circuits 910, 920, 930 and 940 are between the first and second level I/O circuits. In FIG. 5A, the scrambling may be performed at the controller.

The divisions Div0-Div3 of FIG. 5A are not depicted for simplicity. In particular, the scrambling circuits 910, 920, 930 and 940 are connected between the L1 I/O circuit and the L2 I/O circuits for Div0-Div3, respectively. In this case, the scrambling occurs within a division. For instance, the scrambling circuit 910 can receive a unit of bad column data and a unit of error detection data from the controller, e.g., via a path 911, and transfer the unit of bad column data to the L2 I/O circuit 514 via the path 912 while transferring the unit of error detection data to the L2 I/O circuit 515. The unit of bad column data can then be transferred to the latches 512, e.g., via the path 504, and the unit of error detection data can be transferred to the latches 513. The unit of error detection data is subsequently written to a group of memory cells associated with the latches 512, and the unit of error detection data is subsequently written to a group of memory cells associated with the latches 513.

Figure 11A:
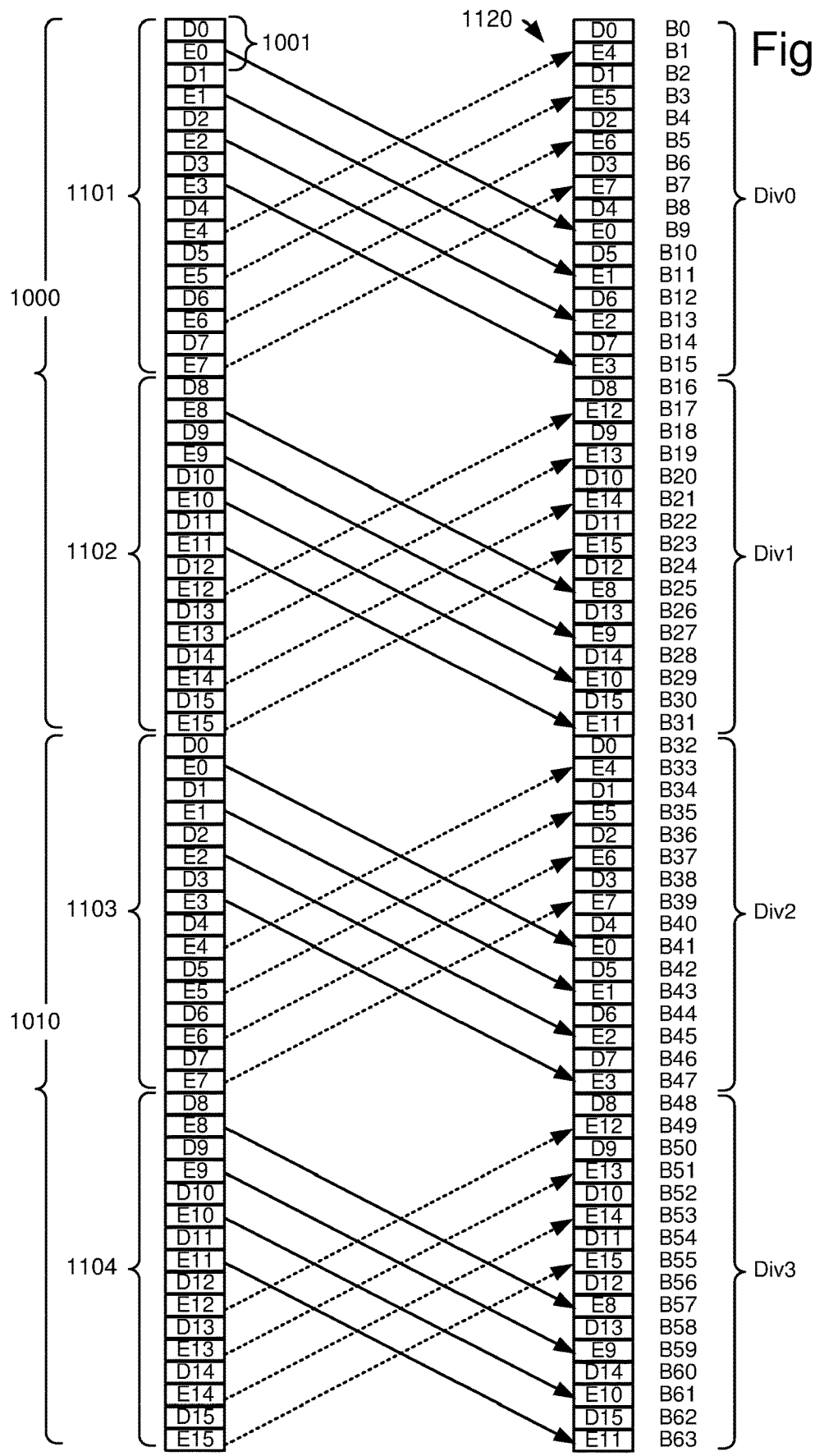
FIG. 11A depicts an example of scrambling separate portions 1101-1104 of the sequences 1000 and 1010 of FIG. 10A over a half-length of the sequence.

FIG. 11A, discussed further below, provides an example of scrambling consistent with the approach of FIG. 9A. The distance between a unit of bad column data and the related unit of error detection data is eight bytes or 64 memory cells. See bytes B0 and B9 which store a unit of bad column data, D0, and the related unit of error detection data, E0, respectively.

FIG. 9B depicts access circuitry 569b which is another alternative to the access circuitry 569 of FIG. 5A, where scrambling circuits 915a, 915b, 925a, 925b, 935a, 935b, 945a and 945b are between the second level I/O circuits and the latches. The divisions Div0-Div3 of FIG. 5A are not depicted for simplicity. The scrambling circuits 915a, 915b, 925a, 925b, 935a, 935b, 945a and 945b are connected between the L2 I/O circuits 514, 515, 524, 525, 534, 535, 544 and 545, respectively, and the latches 512, 513, 522, 523, 532, 533, 533, 542 and 543, respectively. In this case, the scrambling occurs within one half of a division. For instance, the scrambling circuit 915a can receive a unit of bad column data from the L2 I/O circuit 514, e.g., via a path 913, and transfer the unit to the latches 512, e.g., via the path 914. Similarly, the scrambling circuit 915b can receive a unit of error detection data from the L2 I/O circuit 515 and transfer the unit to the latches 513. The unit of error detection data is subsequently written to a group of memory cells associated with the latches 512, and the unit of error detection data is subsequently written to a group of memory cells associated with the latches 513.

The examples of FIGS. 9A and 9B perform scrambling of data within a division of memory cells. Generally, when the scrambling circuit is relatively close to the memory cells in the data path between the controller and the memory cells, the separation between a unit of bad column data and the related unit of error detection data is relatively smaller. The scrambling circuit is closer to the memory cells in FIG. 9B than in FIG. 9A.

In FIGS. 9A and 9B, the scrambling circuits can include a multiplexer and demultiplexer for rearranging data units as described herein.

Figure 12A:
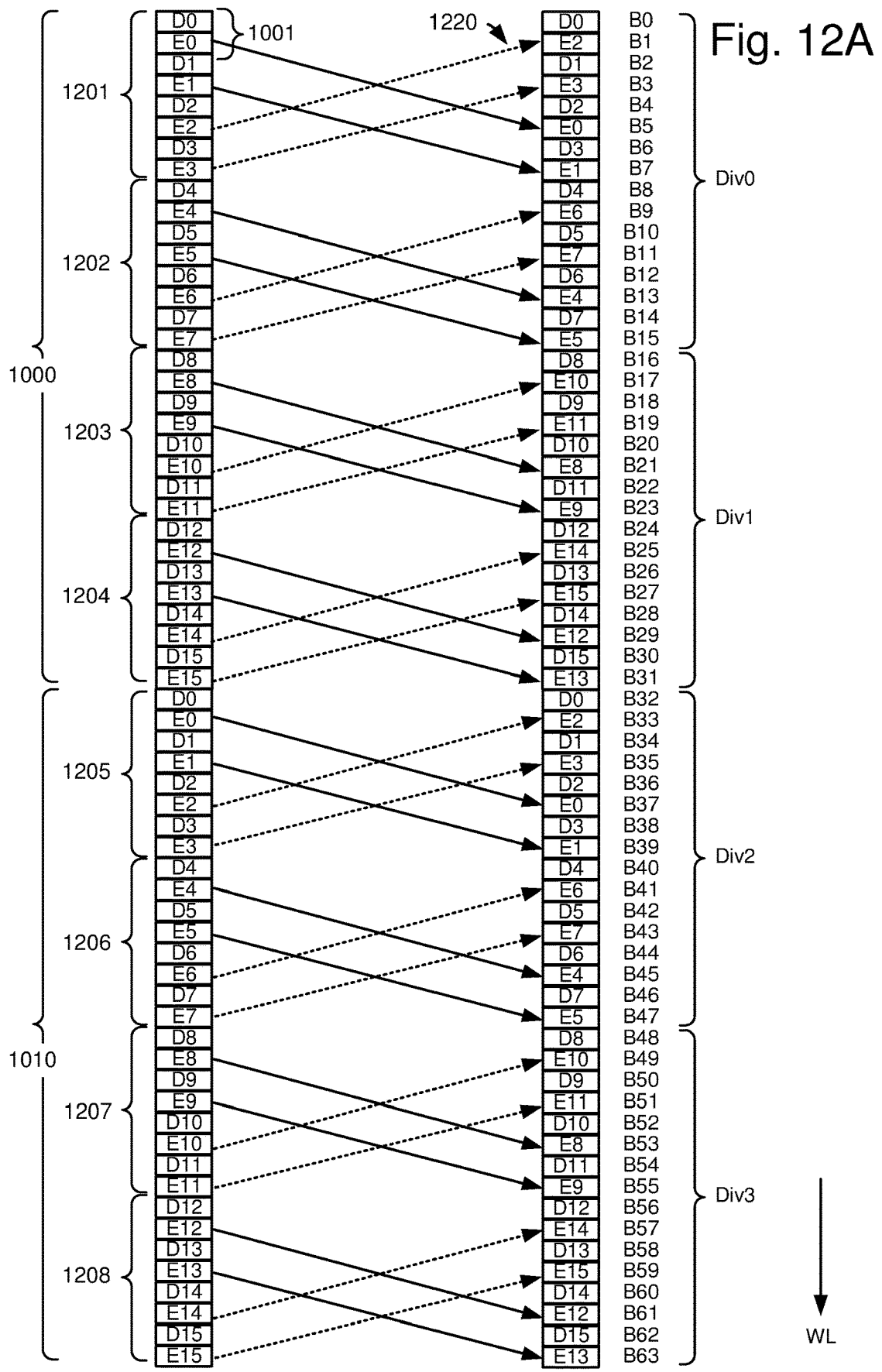
FIG. 12A depicts an example of scrambling separate portions 1201-1208 of the sequences 1000 and 1010 of FIG. 10A over a quarter length of the sequence.

FIG. 12A, discussed further below, provides an example of scrambling with the approach of FIG. 9B. The distance between a unit of bad column data and the related unit of error detection data is four bytes or 16 memory cells. See bytes B0 and B5 which store D0 and E0, respectively.

Figure 10A:
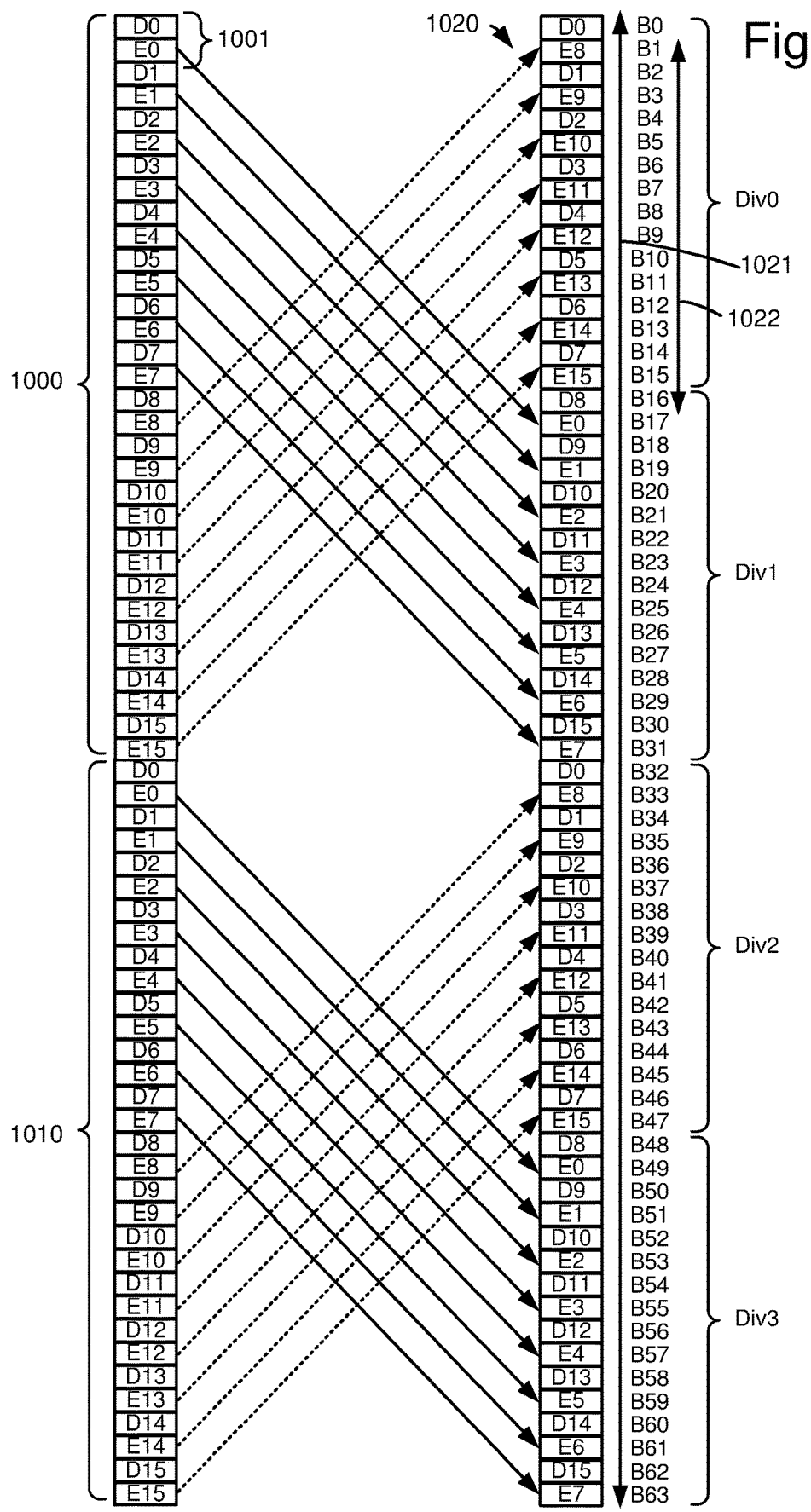
FIG. 10A depicts an example of scrambling a sequence of alternating units of bad column data and error detection data over a full length of the sequence, where two copies of the sequence are provided as sequences 1000 and 1010.

FIG. 10A depicts an example of scrambling a sequence of alternating units of bad column data and error detection data over a full length of the sequence, where two copies of the sequence are provided as sequences 1000 and 1010. In one approach, the scrambling is performed at the scrambling circuit 148 of the controller 122. Each sequence include 32 data units, as an example. The sixteen units of bad column data, D0-D15 alternate with the sixteen units of error detection data, E0-E15. A series of bytes of memory cells, B0-B63, is also depicted, extending in a word line (WL) direction the top of the page to the bottom. The series of memory cells is consistent with FIG. 5A and includes the bytes B0-B63 in Div0-Div3. Each byte comprises eight memory cells and is an example of a group of memory cells to which a unit of data is written, or from which a unit of data is read. In other approaches, a unit of data is written to less than or more than one byte of memory cells.

Each sequence 1000, 1010 includes adjacent related units, including a bad column unit and a related unit of error detection data, which is calculated from the bad column unit. For example, a pair of related units 1001 forms a word and includes a bad column unit D0 and a related unit of error detection data E0. The sequences 1000 and 1010 represent the units before they are scrambled.

The sequence 1020 represents the units after they are scrambled. The scrambling separates the two bytes of each word, in this example. The arrows between the sequences 1000 and 1010 and the sequence 1020 depict the scrambling. Each unit is adjacent to a byte in which the unit is stored. For example, in the sequence 1000, D0 is stored in B0 and E0 is stored in B17. The separation or spacing between these related units is therefore 16 bytes. That is, there are 16 bytes of memory cells between B0 and B17.

The separation can be expressed in terms of the length (arrow 1021) of the word line. In one approach, for each unit of bad column data, the respective group of memory cells to which the unit of bad column data is written can be separated from the respective group of memory cells to which the related unit of error detection data is written by at least 10% of a length of the word line. In this example, the separation (arrow 1022) is 25% of the length of the word line. As mentioned, the separation can be at least 1/Nth of the length of the word line when there are N divisions of memory cells along the word line. With N=4 in this example, the separation can be at least ¼th or 25% of the length of the word line.

Moreover, each unit in this pair of units is stored in a different division, e.g., using different L1 input-output circuits. The separation between related units is constant for each pair of related units. In the sequence 1020, D0, which is stored in a group of memory cells denoted by B0 is adjacent to E8, an unrelated unit of error detection data, which is stored in a group of memory cells denoted by B1.

In a next pair of related units in the sequence 1000, D1 is stored in B2 and E1 is stored in B19.

Generally, during the writing of the units of bad column data and the units of error detection data to the plurality of memory cells, a sequence of data comprising the units of bad column data adjacent to the related units of error detection data is scrambled to ensure that the units of bad column data are not adjacent to the related units of error detection data. Moreover, in the examples of FIG. 10A-12B, the scrambling involves changing the location of the units of error detection data. That is, the scrambling rearranges the units of error detection data without rearranging the units of bad column data. However, it is also possible to change the location of the bad column units.

Similarly, in the sequence 1010, D0 is stored in B32 and E0 is stored in B49.

Generally, in FIG. 10A-12B, the sequence 1000 is written to Div0 and Div1, and the sequence 1010 is written to Div2 and Div3.

FIG. 10A indicates that, for each unit of bad column data, the controller is configured to write the unit of bad column data to a respective group of memory cells (e.g., a byte of memory cells) in one of the divisions and to write the related unit of error detection data to a respective group of memory cells in another of the divisions. For example, the unit of bad column data (E0) is written to B17 in Div1 and the related unit of error detection data is written to B0 in Div0.

Also in FIG. 10A, the unit of bad column data and the related unit of error detection data can be written to respective groups of memory cells using different input/output circuits. In particular, referring also to FIG. 5A, where the subset 580 corresponds to B0-B7 and the subset 582 corresponds to B16-B23, an apparatus is provided in which a plurality of memory cells connected to a word line comprise a first subset 580 of memory cells and a second subset 582 of memory cells, the input/output circuits comprise a first input/output circuit 514 or 516 associated with the first subset of memory cells and a second input/output circuit 524 or 526 associated with the second subset of memory cells, and for at least one of the units of bad column data, the first input/output circuit is configured to receive the unit of bad column data and the second input/output circuit is configured to receive the related unit of error detection data.

Further, a first set of latches 512 is connected to the first input/output circuit 514; a second set of latches 522 connected to the second input/output circuit 524; and the controller is configured to transfer the at least one of the units of bad column data to the first set of latches via the first input/output circuit and to transfer the related unit of error detection data to the second set of latches via the second input/output circuit.

FIG. 10B depicts an example correspondence between bytes of memory cells and data units in the scrambled sequence of FIG. 10A, and an order of writing the scrambled sequence. A cycle refers to a time period in which data is written to each division. The first through fourth entries for each cycle involve Div0-Div3, respectively. Also, the first and second entries involve the sequence 1000, and the third and fourth entries involve the sequence 1010.

In a first cycle, D0 and E8 are written to B0 and B1, respectively, D8 and E0 are written to B16 and B17, respectively, D0 and E8 are written to B32 and B33, respectively, and D8 and E0 are written to B48 and B49, respectively.

In a second cycle, D1 and E9 are written to B2 and B3, respectively, D9 and E1 are written to B18 and B19, respectively, D1 and E9 are written to B34 and B35, respectively, and D9 and E1 are written to B50 and B51, respectively.

In a third cycle, D2 and E10 are written to B4 and B5, respectively, D10 and E2 are written to B20 and B21, respectively, D2 and E10 are written to B36 and B37, respectively, and D10 and E2 are written to B52 and B53, respectively.

In a fourth cycle, D3 and E11 are written to B6 and B7, respectively, and D11 and E3 are written to B22 and B23, respectively, D3 and E11 are written to B38 and B39, respectively, and D11 and E3 are written to B54 and B55, respectively.

In a fifth cycle, D4 and E12 are written to B8 and B9, respectively, and D12 and E4 are written to B24 and B25, respectively, D4 and E12 are written to B40 and B41, respectively, and D12 and E4 are written to B56 and B57, respectively.

In a sixth cycle, D5 and E13 are written to B10 and B11, respectively, and D13 and E5 are written to B26 and B27, respectively, D5 and E13 are written to B42 and B43, respectively, and D13 and E5 are written to B58 and B59, respectively.

In a seventh cycle, D6 and E14 are written to B12 and B13, respectively, and D14 and E6 are written to B28 and B29, respectively, D6 and E14 are written to B44 and B45, respectively, and D14 and E6 are written to B60 and B61, respectively.

In an eighth cycle, D7 and E15 are written to B14 and B15, respectively, and D15 and E7 are written to B30 and B31, respectively, D7 and E15 are written to B46 and B47, respectively, and D15 and E7 are written to B62 and B63, respectively.

FIGS. 11A and 12A show that different portions of the sequence are separately scrambled.

FIG. 11A depicts an example of scrambling separate portions 1101-1104 of the sequences 1000 and 1010 of FIG. 10A over a half-length of the sequence. Specifically, portions 1101 and 1102 of the sequence 1000 are scrambled separately, and portions 1103 and 1104 of the sequence 1010 are scrambled separately. The portions 1101-1104 are scrambled within Div0-Div3, respectively. As mentioned, the separation between a bad column data unit and a related unit of error detection data is smaller than in FIG. 10A.

The sequence 1120 represents the units after they are scrambled. The arrows between the sequences 1000 and 1010 and the sequence 1120 depict the scrambling. For example, in portion 1101 of the sequence 1000, D0 is stored in B0 and E0 is stored in B9. The separation or spacing between these related units is therefore 8 bytes. Moreover, each unit in this pair of units is stored in the same division, e.g., using different L2 input-output circuits. The separation between related units is constant for each pair of related units. In the sequence 1120, D0, which is stored in B0 is now adjacent to E4, an unrelated unit of error detection data, which is stored in B1.

In a next pair of related units in the sequence 1000, D1 is stored in B2 and E1 is stored in B11.

In the portion 1102 of the sequence 1000, D8 is stored in B16 and E8 is stored in B25.

Similarly, in the portion 1103 of the sequence 1010, D0 is stored in B32 and E0 is stored in B41. In the portion 1104 of the sequence 1010, D8 is stored in B48 and E8 is stored in B57.

Also in FIG. 11A, the unit of bad column data and the related unit of error detection data can be written to respective groups of memory cells using different input/output circuits. In particular, referring also to FIG. 5A, where the subset 580 corresponds to B0-B7 and the subset 581 corresponds to B8-B15, an apparatus is provided in which a plurality of memory cells connected to a word line comprise a first subset 580 of memory cells and a second subset 581 of memory cells, the input/output circuits comprise a first input/output circuit 514 associated with the first subset of memory cells and a second input/output circuit 515 associated with the second subset of memory cells, and for at least one of the units of bad column data, the first input/output circuit is configured to receive the unit of bad column data and the second input/output circuit is configured to receive the related unit of error detection data.

Further, a first set of latches 512 is connected to the first input/output circuit 514; a second set of latches 513 connected to the second input/output circuit 515; and the controller is configured to transfer the at least one of the units of bad column data to the first set of latches via the first input/output circuit and to transfer the related unit of error detection data to the second set of latches via the second input/output circuit.

FIG. 11B depicts an example correspondence between bytes of memory cells and data units in the scrambled sequence of FIG. 11A, and an order of writing the scrambled sequence. The first through fourth entries for each cycle involve Div0-Div3, respectively. Also, the first and second entries involve the sequence 1000, and the third and fourth entries involve the sequence 1010.

In a first cycle, D0 and E4 are written to B0 and B1, respectively, and D8 and E12 are written to B16 and B17, respectively, D0 and E4 are written to B32 and B33, respectively, and D8 and E12 are written to B48 and B49, respectively.

In a second cycle, D1 and E5 are written to B2 and B3, respectively, and D9 and E13 are written to B18 and B19, respectively, D1 and E5 are written to B34 and B35, respectively, and D9 and E13 are written to B50 and B51, respectively.

In a third cycle, D2 and E6 are written to B4 and B5, respectively, and D10 and E14 are written to B20 and B21, respectively, D2 and E6 are written to B36 and B37, respectively, and D10 and E14 are written to B52 and B53, respectively.

In a fourth cycle, D3 and E7 are written to B6 and B7, respectively, and D11 and E15 are written to B22 and B23, respectively, D3 and E7 are written to B38 and B39, respectively, and D11 and E15 are written to B54 and B55, respectively.

In a fifth cycle, D4 and E0 are written to B8 and B9, respectively, and D12 and E8 are written to B24 and B25, respectively, D4 and E0 are written to B40 and B41, respectively, and D12 and E8 are written to B56 and B57, respectively.

In a sixth cycle, D5 and E1 are written to B10 and B11, respectively, and D13 and E9 are written to B26 and B27, respectively, D5 and E1 are written to B42 and B43, respectively, and D13 and E9 are written to B58 and B59, respectively.

In a seventh cycle, D6 and E2 are written to B12 and B13, respectively, and D14 and E10 are written to B28 and B29, respectively, D6 and E2 are written to B44 and B45, respectively, and D14 and E10 are written to B60 and B61, respectively.

In an eighth cycle, D7 and E3 are written to B14 and B15, respectively, and D15 and E11 are written to B30 and B31, respectively, D7 and E3 are written to B46 and B47, respectively, and D15 and E11 are written to B62 and B63, respectively.

FIG. 12A depicts an example of scrambling separate portions 1201-1208 of the sequences 1000 and 1010 of FIG. 10A over a quarter length of the sequence. Specifically, portions 1201-1204 of the sequence 1000 are scrambled separately, and portions 1205-1208 of the sequence 1010 are scrambled separately. The portions 1201 and 1202 are scrambled within Div0, the portions 1203 and 1204 are scrambled within Div1, the portions 1205 and 1206 are scrambled within Div2, and the portions 1207 and 1208 are scrambled within Div3. The separation between a bad column data unit and a related unit of error detection data is smaller than in FIG. 11A.

The sequence 1220 represents the units after they are scrambled. The arrows between the sequences 1000 and 1010 and the sequence 1220 depict the scrambling. For example, in portion 1201 of the sequence 1000, D0 is stored in B0 and E0 is stored in B5. The separation or spacing between these related units is therefore 4 bytes. Moreover, each unit in this pair of units is stored in the same half division, e.g., using one L2 input-output circuits. The separation between related units is constant for each pair of related units. In the sequence 1220, D0, which is stored in B0 is now adjacent to E2, an unrelated unit of error detection data, which is stored in B1.

In a next pair of related units in the sequence 1000, D1 is stored in B2 and E1 is stored in B7.

In the portion 1202 of the sequence 1000, D4 is stored in B8 and E4 is stored in B13.

Figure 13A:
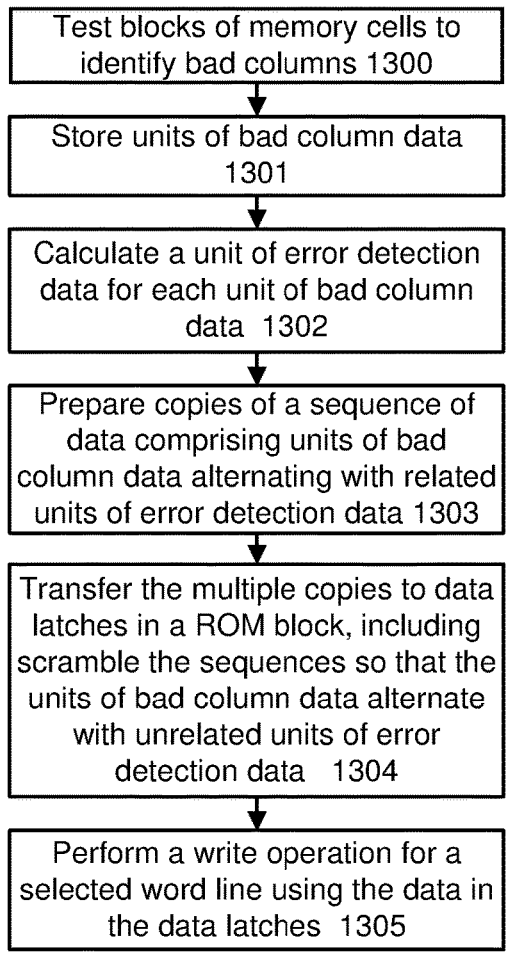
FIG. 13A depicts an example process for obtaining bad column data and error detection data and writing the data to a selected word line in the bad column block B0-0 of FIG. 2.

The spacing between a unit of bad column data and a related unit of error detection data is large enough in FIGS. 11A, 12A and 13A so that the two units are in different columns. The likelihood of both units being stored in a bad column is therefore reduced, and the robustness of the process is improved.

FIG. 12B depicts an example correspondence between bytes of memory cells and data units in the scrambled sequence of FIG. 12A, and an order of writing the scrambled sequence. The first through fourth entries for each cycle involve Div0-Div3, respectively. Also, the first and second entries involve the sequence 1000, and the third and fourth entries involve the sequence 1010.

In a first cycle, D0 and E2 are written to B0 and B1, respectively, and D8 and E10 are written to B16 and B17, respectively, D0 and E2 are written to B32 and B33, respectively, and D8 and E10 are written to B48 and B49, respectively.

In a second cycle, D1 and E3 are written to B2 and B3, respectively, and D9 and E11 are written to B18 and B19, respectively, D1 and E3 are written to B34 and B35, respectively, and D9 and E11 are written to B50 and B51, respectively.

In a third cycle, D2 and E0 are written to B4 and B5, respectively, and D10 and E8 are written to B20 and B21, respectively, D2 and E0 are written to B36 and B37, respectively, and D10 and E8 are written to B52 and B53, respectively.

In a fourth cycle, D3 and E1 are written to B6 and B7, respectively, and D11 and E9 are written to B22 and B23, respectively, D3 and E1 are written to B38 and B39, respectively, and D11 and E9 are written to B54 and B55, respectively.

In a fifth cycle, D4 and E6 are written to B8 and B9, respectively, and D12 and E14 are written to B24 and B25, respectively, D4 and E6 are written to B40 and B41, respectively, and D12 and E14 are written to B56 and B57, respectively.

In a sixth cycle, D5 and E7 are written to B10 and B11, respectively, and D13 and E15 are written to B26 and B27, respectively, D5 and E7 are written to B42 and B43, respectively, and D13 and E15 are written to B58 and B59, respectively.

In a seventh cycle, D6 and E4 are written to B12 and B13, respectively, and D14 and E12 are written to B28 and B29, respectively, D6 and E4 are written to B44 and B45, respectively, and D14 and E12 are written to B60 and B61, respectively.

In an eighth cycle, D7 and E5 are written to B14 and B15, respectively, and D15 and E13 are written to B30 and B31, respectively, D7 and E5 are written to B46 and B47, respectively, and D15 and E13 are written to B62 and B63, respectively.

FIG. 13A depicts an example process for obtaining bad column data and error detection data and writing the data to a selected word line in the bad column block B0-0 of FIG. 2. Step 1300 includes testing blocks of memory cells to identify bad columns. For example, these may be user data blocks. Step 1301 includes storing the units of bad column data. For example, the units can be stored temporarily in a working memory of the controller 122 such as the ROM 160 (FIG. 1). Step 1302 includes calculating a unit of error detection data for each unit of bad column data. One example of error detection data is a set of parity bits. Example equations for calculating parity bits are provided in FIG. 14B. Step 1303 includes preparing copies of a sequence of data comprising the units of bad column data alternating with related units of error detection data. As mentioned, a unit of error detection data is related to a unit of bad column data when the unit of error detection data is calculated from the unit of bad column data, e.g., using an error detection code. Example sequences 1000 and 1010 were discussed previously.

Step 1304 includes transferring the multiple copies to data latches in a ROM block, including scrambling the sequences so that the units of bad column data alternate with unrelated units of error detection data. A unit of error detection data is unrelated to a unit of bad column data when the unit of error detection data is not calculated from the unit of bad column data. FIGS. 10A, 11A and 12A provide examples of scrambling. Step 1305 includes performing a write operation for a selected word line using data in the data latches. This can involve repeatedly applying a program pulse to the selected word line followed by performing a verify test to determine if the memory cells have completed programming, in a series of program verify-operations.

In addition to, or as an alternative to, bad column data, the data which is written can include other types of information such as bad block data, overhead data or any type of non-user data. Note that the bad column information typically involves less than one word line so that multiple copies can be stored in the memory cells connected to one word line. However, it is possible for the multiple copies to be stored in memory cells connected to more than one word line. It is also possible that the bad column data consumes less than one word line.

Figure 13B:
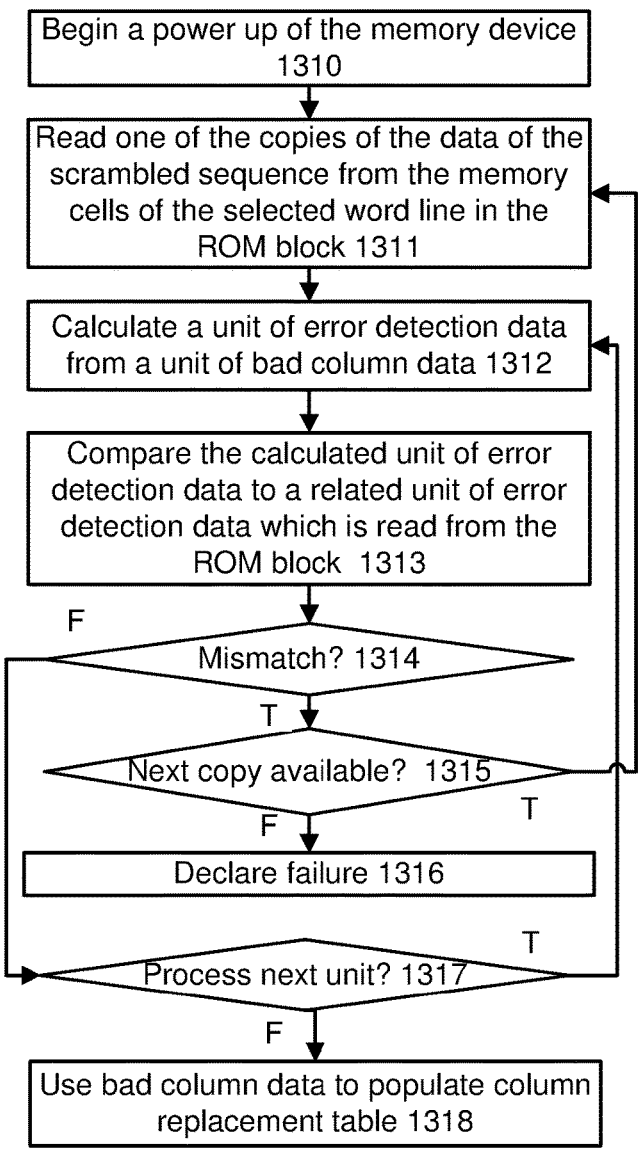
FIG. 13B depicts an example process for reading and validating the bad column data from the selected word line in the block B0-0 of FIG. 2, consistent with the process of FIG. 13A.

FIG. 13B depicts an example process for reading and validating the bad column data from the selected word line in the block B0-0 of FIG. 2, consistent with the process of FIG. 13A. Step 1310 includes beginning a power up of the memory device. Step 1311 includes reading one of the copies of the data of the scrambled sequence from the memory cells of the selected word line in the ROM block. Step 1312 includes calculating a unit of error detection data from a unit of bad column data. See FIGS. 14A and 14B. Step 1313 includes comparing the calculated unit of error detection data to a related unit of error detection data which is read from the ROM block. For example, the comparison circuit 150 of FIG. 1A may be used. The comparison can involve an XOR operation between each bit of the calculated unit of error detection data and each corresponding bit of the related unit of error detection data which is read from the ROM block. When the output of the XOR is 0, the two compared bits match. When the output of the XOR is 1, the two compared bits do not match.

A decision step 1314 determines if there is a mismatch in the comparison of step 1313. If the decision step 1314 is true, there is an error in either or both of the unit of bad column data and the related unit of error detection data, and the decision step 1315 determines if there is a next copy of the sequence available. If the decision step 1315 is true, step 1311 is repeated by reading the next copy of the data, e.g., on the selected word line. Essentially, when there is an error in one sequence of the data, that sequence is unusable so that the next sequence is used. If the decision step 1315 is false, there is no next sequence available on the word line. Step 1316 then declares a failure of the power up process. Or, potentially, another ROM block can be accessed to locate a good copy of the sequence.

If decision step 1314 is false, the current unit has been validated as being error-free, and a decision step 1317 determines if there is a next unit to process. If the decision step 1317 is true, step 1312 is repeated for the next unit. If the decision step 1317 is false, step 1318 uses the bad column data to populate the column replacement table.

This example validates one unit of bad column data at a time. Another option is to validate multiple units of bad column data in parallel. Moreover, the decoding of step 1318 can be for all units of bad column data after they have been validated, in one approach. One or more units of bad column data can identify a bad column.

FIG. 14A depicts a table showing units of bad column data and related calculated units of error detection data, consistent with FIG. 13B, step 1312. The units of bad column data are represented by D0-D15 and the corresponding calculated units of error detection data are represented by E0-E15, respectively. This information can be maintained at the controller, for example.

FIG. 14B depicts example equations for calculating a unit of error detection data for a unit of bad column data consistent with FIG. 13B, step 1312 and FIG. 14A. The bits of a unit of bad column data are data[0]-data[7] and the bits of a unit of error detection data are b[0]-b[7]. The symbol "^" denotes an XOR operation and "~" denotes a NOT operation. In this example, bit[7]=data[7]^data[5]^data[2]^data[0]; bit[6]=data[6]^data[5]^data[4]^data[2]^data[1]^data[0]; bit[5]=data[4]^data[3]^data[2]^data[1]; bit[4]=data[7]^data[3]^data[2]^data[1]^data[0]; bit[3]=~(data[7]^data[6]^data[5]^data[1]); bit[2]=~(data[7]^data[6]^data[5]^data[4]^data[0]);

bit[1]=~(data[7]^data[6]^data[4]^4 data[3]^data[2]^data[0]); and bit[0]=data[6]^data[3]^data[1]^data[0].

The calculated data can also be error-correction data. Various type of codes can be used to calculate the error detection bits, including a linear code. One example is a (16,8) linear code, i.e., a code having a length of n=16 bits and a rank of k=8. This code can detect any four bits in error. The rank is the number of code words in the basis of a code and the number of rows in its generating matrix.

FIG. 15A depicts an example process for performing a program operation for a selected word line in block of user data. Once the bad column data is stored in the ROM block, a user data block can be written. Step 1500 begins a program operation for a selected word line in a user data block. Step 1501 determines a column address of a word of write data. This column address is for one of the primary divisions of memory cells. A decision step 1502 determines if the address is for a bad column, e.g., by accessing the column replacement table 147. If the decision step 1502 is true, step 1503 includes changing the address to the address of a corresponding redundant column in a redundant division of memory cells. This can be done by the column replacement circuit 146.

Step 1504 includes transferring the word of data from the controller to the latches associated with the column address. If the decision step 1502 is false, step 1504 is reached without changing the column address.

A decision step 1505 determines if there is a next word to transfer to the latches. If the decision step 1505 is true, step 1501 is repeated for the column address of the next word. If the decision step 1505 is false, the write data has been loaded into the latches for the program operation, and step 1506 includes performing program verify-operations until programming is completed.

FIG. 15B depicts an example process for performing a read operation for a selected word line in block of user data, consistent with FIG. 15A. Step 1510 begins a read operation for a selected word line in a block of user data. Step 1511 includes reading a page of data and storing the data in latches. Step 1512 includes determining a column address of a word of data to be output from the latches. This column address is for one of the primary divisions of memory cells. A decision step 1513 determines if the address is for a bad column, e.g., by accessing the column replacement table 147. If the decision step 1513 is true, step 1514 includes changing the address to the address of a corresponding redundant column in a redundant division of memory cells. Step 1515 includes transferring the word of data from the latches associated with the column address to the controller. If the decision step 1513 is false, step 1515 is reached without changing the column address.

A decision step 1516 determines if there is a next word to output from the latches. If the decision step 1516 is true, step 1512 is repeated for the column address of the next word. If the decision step 1516 is false, the read data has been output from the latches for the read operation, and step 1517 indicates the read operation is completed.

Accordingly, it can be see that in one implementation, an apparatus comprises: a plurality of memory cells connected to a word line and arranged in columns, each memory cell connected to a respective bit line; input/output circuits connected to the bit lines; and a controller connected to the input/output circuits, the controller configured to write units of bad column data and units of error detection data to the plurality of memory cells, wherein for each unit of bad column data, the controller is configured to write the unit of bad column data to a respective group of memory cells, to write an unrelated unit of error detection data to a respective group of memory cells which is adjacent to the respective group of memory cells to which the unit of bad column data is written, and to write a related unit of error detection data to a respective group of memory cells which is non-adjacent to the respective group of memory cells to which the unit of bad column data is written.

In another implementation, a method comprises: determining a unit of error detection data for a unit of bad column data; writing the unit of the bad column data to a group of memory cells connected to a word line; and writing the unit of the error detection data to a group of memory cells connected to a word line, wherein the group of memory cells to which the unit of the bad column data is written is non-adjacent to a group of memory cells to which the unit of error detection data is written.

In another implementation, an apparatus comprises: a first subset of memory cells connected to a word line and to respective bit lines; a second subset of memory cells connected to the word line and to respective bit lines; a first input/output circuit connected to the respective bit lines of the first subset of memory cells; a second input/output circuit connected to the respective bit lines of the second subset of memory cells; means for writing a unit of data to the first subset of memory cells using the first input/output circuit; and means for writing a unit of parity bits which is calculated from the unit of data to the second subset of memory cells using the second input/output circuit.

The apparatus can further include means for writing a unit of parity bits which is not calculated from the unit of data to the first subset of memory cells using the first input/output circuit. The means for writing a unit of data and the means for writing a unit of parity bits which is not calculated from the unit of data can include, e.g., the controller 122, the access circuitry 569, 569*a* and 569*b* of FIGS. 5A, 9A and 9B, respectively, including the input-output circuits and latches, and can perform the process of the flowchart of FIG. 13A.

The means for writing a unit of data, the means for writing a unit of parity bits which is calculated from the unit of data, and the means for writing a unit of parity bits which is not calculated from the unit of data can include, e.g., the controller 122, the access circuitry 569, 569*a* and 569*b* of FIGS. 5A, 9A and 9B, respectively, including the input-output circuits and latches, and can perform the process of the flowchart of FIG. 13A.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:
1. A non-volatile apparatus, comprising:
 a plurality of bit lines;
 a word line;
 a plurality of memory cells connected to the word line and arranged in columns, each memory cell connected to a respective bit line of the plurality of bit lines;
 input/output circuits connected to the bit lines; and a controller connected to the input/output circuits, the controller is configured to write units of bad column data and units of error detection data to the plurality of memory cells, wherein for each unit of bad column data the controller is configured to write the unit of bad column data to a respective group of memory cells, to write an unrelated unit of error detection data to a respective group of memory cells which is adjacent to the respective group of memory cells to which the unit of bad column data is written and to write a related unit of error detection data to a respective group of memory cells which is non-adjacent to the respective group of memory cells to which the unit of bad column data is written.

2. The non-volatile apparatus of claim 1, wherein:
the controller is configured to alternately write a unit of bad column data and an unrelated unit of the error detection data to adjacent groups of memory cells along the word line.

3. The non-volatile apparatus of claim 1, wherein:
for each unit of bad column data, the unrelated unit of error detection data is not calculated from the unit of bad column data and the related unit of error detection data is calculated from the unit of bad column data.

4. The non-volatile apparatus of claim 1, wherein:
the plurality of memory cells are arranged in divisions; and
for each unit of bad column data, the controller is configured to write the unit of bad column data to the respective group of memory cells in one of the divisions and to write the related unit of error detection data to the respective group of memory cells in another of the divisions.

5. The non-volatile apparatus of claim 1, wherein:
for each unit of bad column data, the respective group of memory cells to which the unit of bad column data is written is separated from the respective group of memory cells to which the related unit of error detection data is written by at least 10% of a length of the word line.

6. The non-volatile apparatus of claim 1, wherein:
the plurality of memory cells comprise a first subset of memory cells and a second subset of memory cells;
the input/output circuits comprise a first input/output circuit associated with the first subset of memory cells and a second input/output circuit associated with the second subset of memory cells; and
for at least one of the units of bad column data, the first input/output circuit is configured to receive the unit of bad column data and the second input/output circuit is configured to receive the related unit of error detection data.

7. The non-volatile apparatus of claim 6, further comprising:
a first set of latches connected to the first input/output circuit; and
a second set of latches connected to the second input/output circuit, the controller is configured to transfer the at least one of the units of bad column data to the first set of latches via the first input/output circuit and to transfer the related unit of error detection data to the second set of latches via the second input/output circuit.

8. The non-volatile apparatus of claim 1, wherein:
the controller is configured to write multiple copies of the units of bad column data and the units of error detection data to the plurality of memory cells; and for each copy and for each unit of bad column data, the controller is configured to write the unit of bad column data to a respective group of memory cells, to write an unrelated unit of error detection data to a respective group of memory cells which is adjacent to the respective group of memory cells to which the unit of bad column data is written, and to write a related unit of error detection data to a respective group of memory cells which is non-adjacent to the respective group of memory cells to which the unit of bad column data is written.

9. The non-volatile apparatus of claim 1, wherein:
during the writing of the units of bad column data and the units of error detection data to the plurality of memory cells, a sequence of data comprising the units of bad column data adjacent to the related units of error detection data is scrambled to ensure that the units of bad column data are not adjacent to the related units of error detection data.

10. The non-volatile apparatus of claim 9, wherein:
the scrambling rearranges the units of error detection data without rearranging the units of bad column data.

11. The non-volatile apparatus of claim 9, wherein:
different portions of the sequence are separately scrambled.

12. A method, comprising:
determining a unit of error detection data for a unit of bad column data;
writing the unit of bad column data to a group of memory cells connected to a word line; and
writing the unit of error detection data to a group of memory cells connected to the word line, wherein the group of memory cells to which the unit of bad column data is written is non-adjacent to the group of memory cells to which the unit of error detection data is written, the group of memory cells to which the unit of bad column data is written is adjacent to a group of memory cells to which an unrelated unit of error detection data is written, and the unrelated unit of error detection data is not determined from the unit of bad column data.

13. The method of claim 12, wherein:
one input/output circuit is used to write the unit of bad column data and another input/output circuit is used to write the unit of error detection data.

14. The method of claim 13, further comprising:
receiving the unit of bad column data and the unit of error detection data at a common input/output circuit;
transferring the unit of bad column data from the common input/output circuit to the one input/output circuit; and
transferring the unit of error detection data from the common input/output circuit to the another input/output circuit.

15. An apparatus, comprising:
a first input/output circuit configured to connect to respective bit lines of a first subset of memory cells and a second subset of memory cells, the first subset of memory cells is adjacent to the second subset of memory cells;
a second input/output circuit configured to connect to respective bit lines of a third subset of memory cells, the third subset of memory cells is non-adjacent to the first and second subsets of memory cells; and
a control circuit configured to write a unit of data to the first subset of memory cells using the first input/output circuit, to write a unit of parity bits which is not calculated from the unit of data to the second subset of memory cells using the first input/output circuit, and to write a unit of parity bits which is calculated from the unit of data to the third subset of memory cells using the second input/output circuit.

16. The apparatus of claim 15, further comprising:

a common input/output circuit connected to the first input/output circuit and the second input/output circuit.

17. The apparatus of claim 15, further comprising:

a first set of latches configured to receive the unit of data and the unit of parity bits which is not calculated from the unit of data from the first input/output circuit; and a second set of latches configured to receive the unit of parity bits which is calculated from the unit of data from the second input/output circuit.

18. The apparatus of claim 15, wherein:

the first, second and third subsets of memory cells are connected to a word line.

19. The apparatus of claim 15, wherein:

the first and second subsets of memory cells are in one column of NAND strings and the third subset of memory cells is in another column of NAND strings; and the one column of NAND strings and the another column of NAND strings are separated by one or more other columns of NAND strings.

20. The apparatus of claim 19, wherein:

the one column of NAND strings and the another column of NAND strings are in one division of a plurality of divisions of a block of memory cells.

\* \* \* \* \*